US012652758B2

(12) United States Patent (10) Patent No.: US 12,652,758 B2
Jung et al. (45) Date of Patent: Jun. 9, 2026

(54) ELECTRONIC DEVICE INCLUDING STRUCTURE FOR REDUCING DAMAGE TO FLEXIBLE PRINTED CIRCUIT BOARD

(71) Applicant: SAMSUNG ELECTRONICS CO., LTD., Suwon-si (KR)

(72) Inventors: Youngjin Jung, Suwon-si (KR); Kihwan Kwon, Suwon-si (KR); Hongseok Kim, Suwon-si (KR); Honjeong Park, Suwon-si (KR); Sujin Cho, Suwon-si (KR); Woosung Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 231 days.

(21) Appl. No.: 18/645,521

(22) Filed: Apr. 25, 2024

(65) Prior Publication Data

US 2025/0031308 A1     Jan. 23, 2025

Related U.S. Application Data

(63) Continuation of application No. PCT/KR2024/004668, filed on Apr. 8, 2024.

(30) Foreign Application Priority Data

Jul. 20, 2023   (KR) ........................ 10-2023-0094893
Aug. 18, 2023   (KR) ........................ 10-2023-0108639
Nov. 8, 2023    (KR) ........................ 10-2023-0153808

(51) Int. Cl.
*H05K 1/14*      (2006.01)
*G06F 1/16*      (2006.01)
*H05K 5/02*      (2006.01)

(52) U.S. Cl.
CPC ........... *H05K 1/148* (2013.01); *G06F 1/1652* (2013.01); *G06F 1/1656* (2013.01);
(Continued)

(58) Field of Classification Search
CPC ....................................................... H05K 1/148
(Continued)

(56) References Cited

U.S. PATENT DOCUMENTS 6,749,442 B2    6/2004  Matsuo
11,334,122 B2    5/2022  Hsu
(Continued)

FOREIGN PATENT DOCUMENTS

CN      116264757       6/2023
EP      4113245 A1      1/2023
(Continued)

OTHER PUBLICATIONS

Search Report and Written Opinion dated Jul. 29, 2024 issued in International Patent Application No. PCT/KR2024/004668.

*Primary Examiner* — Stanley Tso
(74) *Attorney, Agent, or Firm* — Nixon & Vanderhye, P.C.

(57)     ABSTRACT

According to an embodiment, an electronic device includes: a first printed circuit board (PCB), a second PCB spaced apart from the first PCB, and a flexible printed circuit board (FPCB) connecting the first printed circuit board and the second printed circuit board. The electronic device includes a support plate including a hole through which a portion of the FPCB passes, and a waterproof member comprising a waterproof material disposed in the hole. The flexible printed circuit board includes a first connector connected the first PCB, a second connector, and a slit separating the first connector and the second connector. A portion of the slit may be disposed in the waterproof member.

20 Claims, 10 Drawing Sheets

(52) U.S. Cl.
CPC ......... *G06F 1/1681* (2013.01); *H05K 5/0226*
(2013.01); *H05K 2201/052* (2013.01)

(58) Field of Classification Search
USPC .......................................................... 361/749
See application file for complete search history.

(56) References Cited

U.S. PATENT DOCUMENTS

| | | | |
|---|---|---|---|
| 11,353,922 B2 | 6/2022 | Lee | |
| 11,528,349 B2 | 12/2022 | Kim | |
| 11,700,693 B2 | 7/2023 | Woo et al. | |
| 2011/0090652 A1* | 4/2011 | Wee ..................... | H02G 15/013 |
| | | | 361/749 |
| 2020/0177979 A1* | 6/2020 | Cho ..................... | H04M 1/0274 |
| 2022/0276673 A1 | 9/2022 | Kim | |
| 2022/0338362 A1 | 10/2022 | Morino | |

| | | | |
|---|---|---|---|
| 2023/0007114 A1 | 1/2023 | Cho et al. | |
| 2023/0043759 A1 | 2/2023 | Kang et al. | |
| 2023/0051260 A1 | 2/2023 | An et al. | |
| 2023/0413427 A1 | 12/2023 | Jeong et al. | |

FOREIGN PATENT DOCUMENTS

| | | | |
|---|---|---|---|
| JP | 2003-123873 | | 4/2003 |
| KR | 10-2022-0126576 | | 9/2022 |
| KR | 10-2023-0006350 | | 1/2023 |
| KR | 10-2023-0022775 | | 2/2023 |
| KR | 10-2023-0023166 | | 2/2023 |
| KR | 10-2023-0023268 | | 2/2023 |
| KR | 20230022775 | A | 2/2023 |
| KR | 20240020128 | A | 2/2024 |
| KR | 10-2729176 | | 11/2024 |
| WO | 2021201575 | A1 | 10/2021 |
| WO | 2022257582 | A1 | 12/2022 |

\* cited by examiner

ELECTRONIC DEVICE INCLUDING STRUCTURE FOR REDUCING DAMAGE TO FLEXIBLE PRINTED CIRCUIT BOARD

CROSS-REFERENCE TO RELATED APPLICATIONS

This application is a continuation of International Application No. PCT/KR2024/004668 designating the United States, filed on Apr. 8, 2024, in the Korean Intellectual Property Receiving Office and claiming priority to Korean Patent Application Nos. 10-2023-0094893, filed on Jul. 20, 2023, 10-2023-0108639, filed on Aug. 18, 2023, and 10-2023-0153808, filed on Nov. 8, 2023, in the Korean Intellectual Property Office, the disclosures of each of which are incorporated by reference herein in their entireties.

BACKGROUND

Field

The disclosure relates to an electronic device including a structure for reducing damage to a flexible printed circuit board.

Description of Related Art

As an electronic device performs various functions to meet needs of users, the electronic device may include a plurality of printed circuit boards (PCBs). A plurality of electronic components of the electronic device may form an electrical connection inside the electronic device, by being disposed on the same PCB or being disposed on different PCBs. As the electronic device become miniaturized, the PCB may be disposed in the electronic device in a partially deformable state in order to secure a disposition space for the electronic components.

The above-described information may be provided as a related art for the purpose of helping understand the present disclosure. No argument or decision is made as to whether any of the above-described content may be applied as a prior art in connection with the present disclosure.

SUMMARY

According to an example embodiment, an electronic device may comprise a first housing, a second housing, and a hinge structure rotatably connecting the first housing and the second housing. The electronic device may comprise a first printed circuit board (PCB) disposed in the first housing, a second PCB disposed in the second housing, and a flexible printed circuit board (FPCB) extending from the first printed circuit board across the hinge structure to the second printed circuit board to connect the first printed circuit board and the second printed circuit board. The electronic device may comprise a support plate coupled to the hinge structure including a hole through which a portion of the FPCB is disposed, and a waterproof member, comprising a waterproof material, disposed in the hole with the portion of the FPCB. The flexible printed circuit board may include a first connector including a first set of conductive pins configured to connect to a first connecting portion of the first PCB, and a second connector including a second set of conductive pins configured to connect to a second connecting portion of the first PCB. The flexible printed circuit board may include a first set of conductive lines connected to the first set of conductive pins, and a second set of conductive lines connected to the second set of conductive pins. The flexible printed circuit board may include a slit formed between the first set of conductive lines and the second set of conductive lines to separate the first connector and the second connector. A portion of the slit may be disposed in the waterproof member.

According to an example embodiment, an electronic device may comprise a first housing, a second housing, and a hinge structure rotatably connecting the first housing and the second housing. The electronic device may comprise a first printed circuit board (PCB) disposed in the first housing, a second PCB disposed in the second housing and spaced apart from the first PCB, and a flexible PCB (FPCB) extending from the first PCB across the hinge structure to the second PCB to connect the first PCB and the second PCB. The electronic device may comprise a support plate on the hinge structure including a hole through which the FPCB passes, an adhesive member, comprising an adhesive material, disposed between the FPCB and the support plate to attach the FPCB to the support plate, and a waterproof member, comprising a waterproof material, disposed in the hole. The FPCB may include a first region connected to the first PCB and including a first connector including a first set of conductive pins and a second connector including a second set of conductive pins and spaced apart from the first connector. The FPCB may include a second region between the support plate and the hinge structure. The FPCB may include a third region connecting the first region and the second region through the hole and including a slit separating the first connector and the second connector. The slit may be at least partially disposed in the waterproof member by extending from the first region into the hole. A size of the first PCB may be greater than a size of the second PCB.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
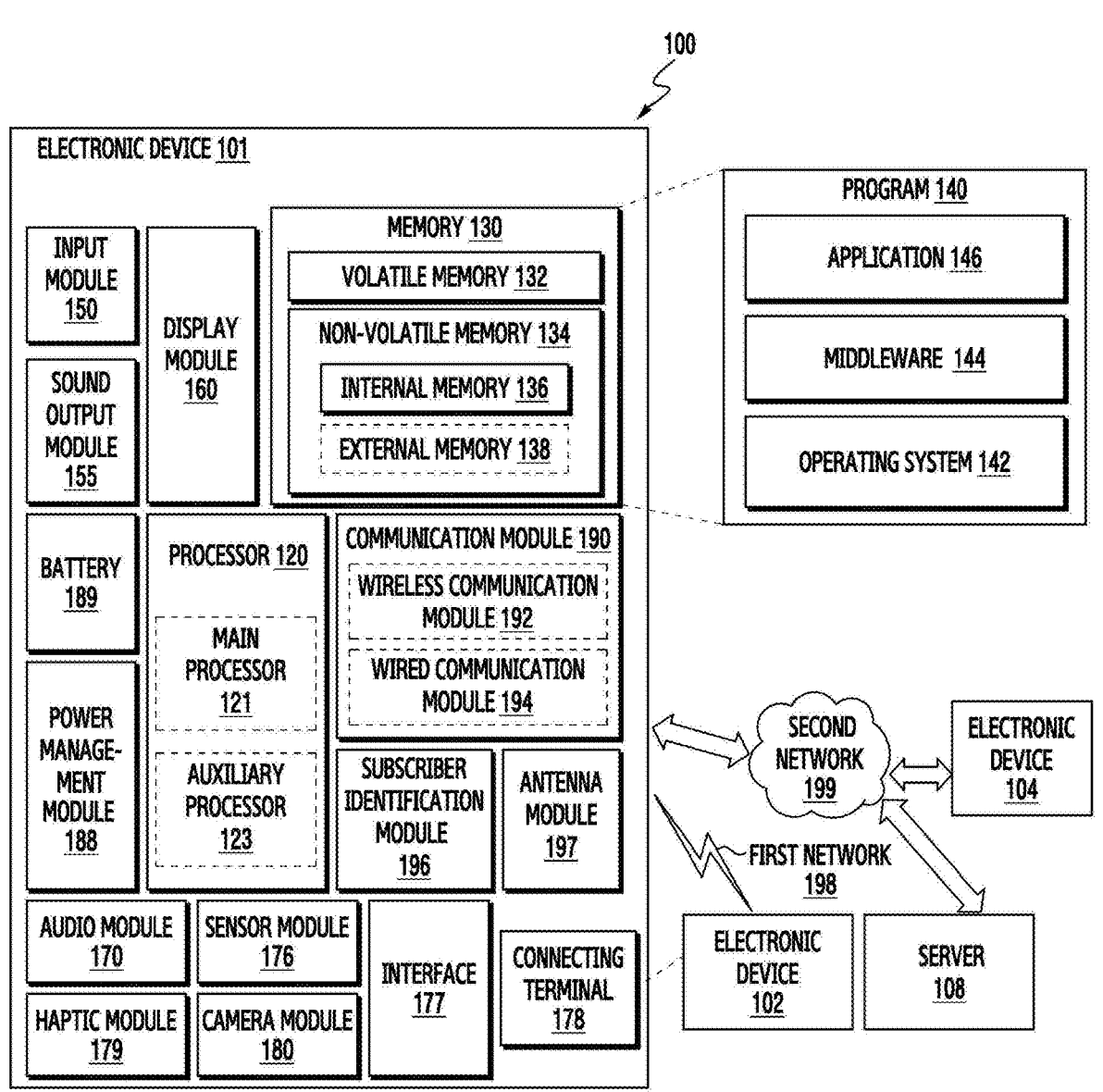
FIG. 1 is a block diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include at least one processor, including various processing circuitry, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
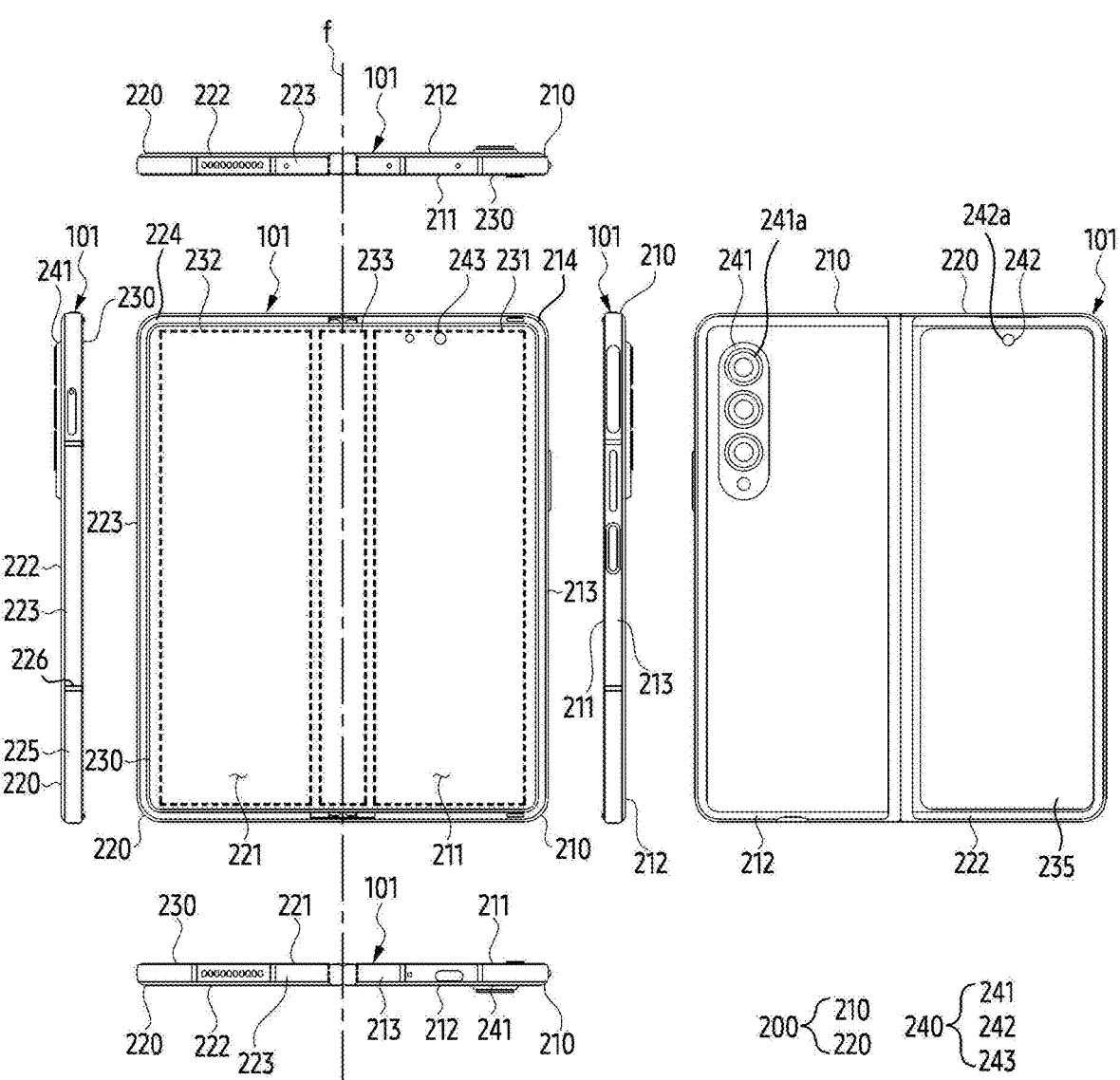
FIG. 2A illustrates an example electronic device in an unfolded state according to various embodiments.
Figure 2B:
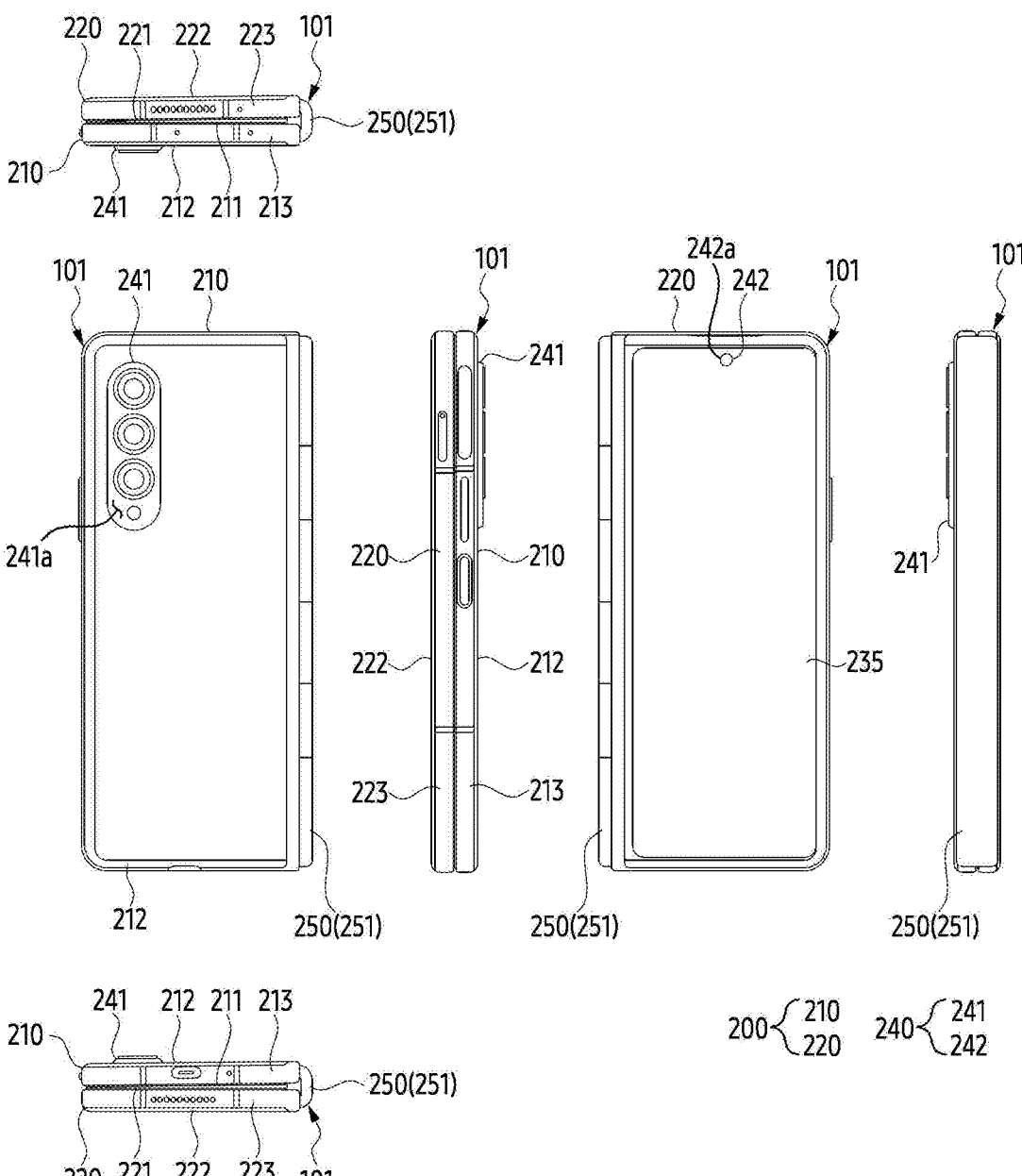
FIG. 2B illustrates an example electronic device in a folded state according to various embodiments.
Figure 2C:
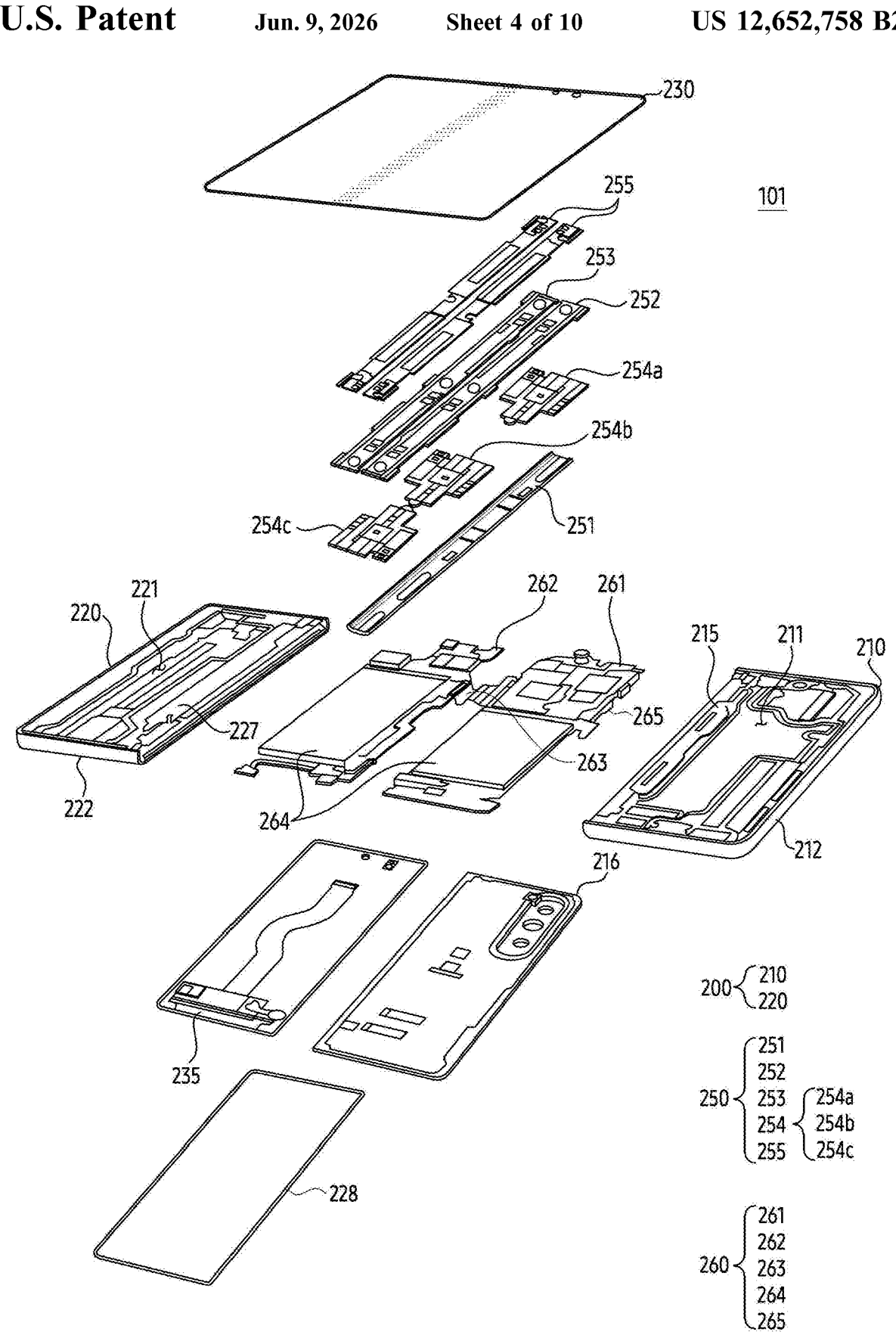
FIG. 2C is an exploded view of an example electronic device according to various embodiments.

FIG. 2A illustrates an example electronic device in an unfolded state according to various embodiments. FIG. 2B illustrates an example electronic device in a folded state according to various embodiments. FIG. 2C is an exploded view of an electronic device according to various embodiments.

Referring to FIGS. 2A, 2B, and 2C, an electronic device 101 may include a housing 200 including a first housing 210 and a second housing 220, a display 230, at least one camera 240 (e.g., a camera module 180 of FIG. 1), a hinge structure 250, and/or at least one electronic component 260.

The first housing 210 and the second housing 220 may form at least a portion of an outer surface of the electronic device 101 that may be gripped by a user. At least a portion of the outer surface of the electronic device 101 defined by the first housing 210 and the second housing 220 may contact a portion of the user's body when the electronic device 101 is used by the user. According to an embodiment, the first housing 210 may include a first front surface 211, a first rear surface 212 facing the first front surface 211 and spaced apart from the first front surface 211, and a first side surface 213 surrounding at least a portion of the first front surface 211 and the first rear surface 212. The first side surface 213 may connect a periphery of the first front surface 211 and a periphery of the first rear surface 212. The first front surface 211, the first rear surface 212, and the first side surface 213 may define an inner space of the first housing 210. According to an embodiment, the first housing 210 may provide a space formed by the first front surface 211, the first rear surface 212, and the first side surface 213 as a space for disposing components of the electronic device 101.

According to an embodiment, the second housing 220 may include a second front surface 221, a second rear surface 222 facing the second front surface 221 and spaced apart from the second front surface 221, and a second side surface 223 surrounding at least a portion of the second front surface 221 and the second rear surface 222. The second side surface 223 may connect a periphery of the second front surface 221 and a periphery of the second rear surface 222. The second front surface 221, the second rear surface 222, and the second side surface 223 may define an inner space of the second housing 220. According to an embodiment, the second housing 220 may provide a space formed by the second front surface 221, the second rear surface 222, and the second side surface 223 surrounding at least a portion of the second front surface 221 and the second rear surface 222 as a space for mounting the components of the electronic device 101. According to an embodiment, the second housing 220 may be coupled to the first housing 210 so as to be rotatable with respect to the first housing 210.

According to an embodiment, each of the first housing 210 and the second housing 220 may include a first protective member 214 and a second protective member 224. The first protective member 214 and the second protective member 224 may be disposed on the first front surface 211 and the second front surface 221 along a periphery of the display 230. According to an embodiment, the first protective member 214 and the second protective member 224 may prevent and/or reduce inflow of a foreign substance (e.g., dust or moisture) through a gap between the display 230 and the first housing 210 and the second housing 220. For example, the first protective member 214 may surround a periphery of a first display region 231 of the display 230, and the second protective member 224 may surround a periphery of a second display region 232 of the display 230. The first protective member 214 may be formed by being attached to the first side surface 213 of the first housing 210 or may be integrally formed with the first side surface 213. The second protective member 224 may be formed by being attached to the second side surface 223 of the second housing 220 or may be integrally formed with the second side surface 223.

According to an embodiment, the first side surface 213 and the second side surface 223 may include a conductive material, a non-conductive material, or a combination thereof. For example, the second side surface 223 may include at least one conductive portion 225 and at least one non-conductive portion 226. The at least one conductive portion 225 may include a plurality of conductive portions spaced apart from each other. The at least one non-conductive portion 226 may be disposed between the plurality of conductive portions. By the at least one non-conductive portion 226 disposed between the plurality of conductive portions, the plurality of conductive portions may be disconnected from each other. According to an embodiment, the plurality of conductive portions and a plurality of non-conductive portions may form an antenna radiator together. The electronic device 101 may be communicable with an external electronic device through the antenna radiator formed by the plurality of conductive portions and the plurality of non-conductive portions.

The display 230 may be configured to display visual information. According to an embodiment, the display 230 may be disposed on the first front surface 211 of the first housing 210 and the second front surface 221 of the second housing 220 across the hinge structure 250. For example, the display 230 may include the first display region 231 disposed on the first front surface 211 of the first housing, the second display region 232 disposed on the second front surface 221 of the second housing, and a third display region 233 disposed between the first display region 231 and the second display region 232. The first display region 231, the second display region 232, and the third display region 233 may form a front surface of the display 230. According to an embodiment, the display 230 may further include a sub-display panel 235 disposed on the second rear surface 222 of the second housing 220. For example, the display 230 may be referred to as a flexible display. According to an embodiment, the display 230 may include a window exposed toward outside of the electronic device 101. The window may protect a surface of the display 230 and may transmit the visual information provided by the display 230 to the outside of the electronic device 101 by including a substantially transparent material. For example, the window may include, but is not limited to, glass (e.g., ultra-thin glass (UTG)) and/or polymers (e.g., polyimide (PI)).

The at least one camera 240 may be configured to obtain an image based on receiving light from an external subject of the electronic device 101. According to an embodiment, the at least one camera 240 may include first cameras 241, a second camera 242, and/or a third camera 243. The first cameras 241 may be disposed in the first housing 210. For example, the first cameras 241 may be disposed inside the first housing 210, and at least some of them may be visible through the first rear surface 212 of the first housing 210. The first cameras 241 may be supported by a bracket (not illustrated) in the first housing 210. The first housing 210 may include at least one opening 241a overlapping the first cameras 241, when the first rear surface 212 is viewed from above. The first cameras 241 may obtain the image based on receiving the light from the outside of the electronic device 101 through the at least one opening 241a.

According to an embodiment, the second camera 242 may be disposed on the second housing 220. For example, the second camera 242 may be disposed inside the second housing 220 and may be visible through the sub-display panel 235. The second housing 220 may include at least one opening 242a overlapping the second camera 242 when the second rear surface 222 is viewed from above. The second camera 242 may obtain the image based on receiving the light from the outside of the electronic device 101 through the at least one opening 242a.

According to an embodiment, the third camera 243 may be disposed in the first housing 210. For example, the third camera 243 may be disposed inside the first housing 210, and at least a portion of it may be visible through the first front surface 211 of the first housing 210. For another example, the third camera 243 may be disposed inside the first housing 210, and at least a portion of it may be visible through the first display region 231 of the display 230. The first display region 231 of the display 230 may include at least one opening (not illustrated) overlapping the third camera 243 when the display 230 is viewed from above. The third camera 243 may obtain the image based on receiving the light from the outside of the display 230 through at least one opening.

According to an embodiment, the second camera 242 and the third camera 243 may be disposed under (e.g., a direction toward the inside of the first housing 210 or the inside of the second housing 220) the display 230. For example, the second camera 242 and the third camera 243 may be a under display camera (UDC). In case that the second camera 242 and the third camera 243 are the under display camera (UDC), a region of the display 230 corresponding to locations of each of the second camera 242 and the third camera 243 may not be an inactive region. For example, in case that the second camera 242 and the third camera 243 are the under display camera (UDC), the region of the display 230 corresponding to the locations of each of the second camera 242 and the third camera 243 may have a pixel density lower than a pixel density of another region of the display 230. The inactive region of the display 230 may refer, for example, to a region of the display 230 that does not include a pixel or that does not emit the light to the outside of the electronic device 101. For another example, the second camera 242 and the third camera 243 may be a punch hole camera. In case that the second camera 242 and the third camera 243 are the punch hole camera, the region of the display 230 corresponding to the locations of each of the second camera 242 and the third camera 243 may be the inactive region. For example, in case that the second camera 242 and the third camera 243 are the punch hole camera, the region of the display 230 corresponding to the locations of each of the second camera 242 and the third camera 243 may include an opening that does not include the pixel.

According to an embodiment, the hinge structure 250 may rotatably connect the first housing 210 and the second housing 220. The hinge structure 250 may be disposed between the first housing 210 and the second housing 220 of the electronic device 101 so that the electronic device 101 may be bent, curved, or folded. For example, the hinge structure 250 may be disposed between a portion of the first side surface 213 and a portion of the second side surface 223 that face each other. The hinge structure 250 may change the electronic device 101 to an unfolding state in which directions in which the first front surface 211 of the first housing 210 and the second front surface 221 of the second housing 220 face are substantially the same each other or to a folding state in which the first front surface 211 and the second front surface 221 face. In case that the electronic device 101 is in the folding state, the first housing 210 and the second housing 220 may be overlaid or overlapped each other, by facing each other.

According to an embodiment, when the electronic device 101 is in the folding state, the direction in which the first front surface 211 faces and the direction in which the second front surface 221 faces may be different from each other. For example, when the electronic device 101 is in the folding state, the direction in which the first front surface 211 faces and the direction in which the second front surface 221 faces may be opposite to each other. For another example, when the electronic device 101 is in the folding state, the direction in which the first front surface 211 faces and the direction in which the second front surface 221 faces may be inclined with respect to each other. In case that the direction in which the first front surface 211 faces is inclined with respect to the direction in which the second front surface 221 faces, the first housing 210 may be inclined with respect to the second housing 220. However, it is not limited thereto. For example, in the folding state of the electronic device 101, the first rear surface 212 of the first housing 210 may face the second rear surface 222 of the second housing 220. In case that the first rear surface 212 and the second rear surface 222 face each other in the folding state of the electronic device 101, the direction in which the first front surface 211 faces and the direction in which the second front surface 221 faces may be opposite to each other. In case that the first rear surface 212 and the second rear surface 222 face each other in the folding state of the electronic device 101, the display 230 may be visible from the outside in the folding state of the electronic device 101.

According to an embodiment, the electronic device 101 may be foldable based on a folding axis f. The folding axis f may refer, for example, to an imaginary line extending through a hinge cover 251 in a direction (e.g., d1 of FIGS. 2A and 2B) substantially parallel to a longitudinal direction of the electronic device 101, but is not limited thereto. For example, the folding axis f may be an imaginary line extending in a direction (e.g., d2 of FIGS. 2A and 2B) substantially perpendicular to the longitudinal direction of the electronic device 101. In case that the folding axis f extends in the direction substantially perpendicular to the longitudinal direction of the electronic device 101, the hinge structure 250 may connect the first housing 210 and the second housing 220 by extending in a direction parallel to the folding axis f. The first housing 210 and the second housing 220 may be rotatable by the hinge structure 250 extending in the direction substantially perpendicular to the longitudinal direction of the electronic device 101.

According to an embodiment, the hinge structure 250 may include the hinge cover 251, a first hinge plate 252, a second hinge plate 253, and a hinge module 254. The hinge cover 251 may surround internal components of the hinge structure 250 and may form an outer surface of the hinge structure 250. According to an embodiment, when the electronic device 101 is in the folding state, at least a portion of the hinge cover 251 surrounding the hinge structure 250 may be exposed to the outside of the electronic device 101 through between the first housing 210 and the second housing 220. According to an embodiment, when the electronic device 101 is in the unfolding state, the hinge cover 251 may not be exposed to the outside of the electronic device 101 by being covered by the first housing 210 and the second housing 220. According to an embodiment, the hinge structure 250 may be at least partially disposed between the housing 200 and the display 230 including the first housing 210 and the second housing 220, but is not limited thereto.

According to an embodiment, the first hinge plate 252 and the second hinge plate 253 may rotatably connect the first housing 210 and the second housing 220 by being coupled to the first housing 210 and the second housing 220, respectively. For example, the first hinge plate 252 may be coupled to a first bracket 215 of the first housing 210, and the second hinge plate 253 may be coupled to a second bracket 227 of the second housing 220. As the first hinge plate 252 and the second hinge plate 253 are coupled to the first bracket 215 and the second bracket 227, respectively, the first housing 210 and the second housing 220 may be rotatable according to the rotation of the first hinge plate 252 and the second hinge plate 253.

The hinge module 254 may rotate the first hinge plate 252 and the second hinge plate 253. For example, the hinge module 254 may rotate the first hinge plate 252 and the second hinge plate 253 with respect to the folding axis f, by including gears that are engaged with each other and rotatable. According to an embodiment, the hinge module 254 may be plural. For example, a plurality of hinge modules 254 may be disposed to be spaced apart from each other at both ends of the first hinge plate 252 and the second hinge plate 253, respectively.

For example, a first hinge module 254a may be spaced apart from a second hinge module 254b. For example, the second hinge module 254b may be coupled to a third hinge module 254c. A flexible printed circuit board 263 may be at least partially disposed in a space between the first hinge module 254a and the second hinge module 254b. The flexible printed circuit board 263 may connect a first printed circuit board 261 and a second printed circuit board 262 through the space between the first hinge module 254a and the second hinge module 254b.

According to an embodiment, the hinge structure 250 may include a buffer member 255. For example, the buffer member 255 may face the display 230. For example, the buffer member 255 may reduce damage to the display 230, by supporting a deformable region (e.g., the third display region 233) of the display 230. For example, by being attached to the display 230, the buffer member 255 may reduce the damage to the display 230 as the hinge structure 250 operates.

According to an embodiment, the first housing 210 may include the first bracket 215 and a first cover 216, and the second housing 220 may include the second bracket 227 and a second cover 228. The first bracket 215 may support components in the first housing 210. The first cover 216 may at least partially cover the components in the first housing 210. The first bracket 215 may define the first housing 210, by being coupled to the first cover 216. The first cover 216 may define a portion of an outer surface of the first housing 210. The second bracket 227 may support components in the second housing 220. The second cover 228 may at least partially cover the components in the second housing 220. The second bracket 227 may define the second housing 220, by being coupled to the second cover 228. The second cover 228 may define a portion of an outer surface of the second housing 220. For example, the display 230 may be disposed on a surface of the first bracket 215 and a surface of the second bracket 227. The first cover 216 may be disposed on another surface of the first bracket 215 opposite to the surface of the first bracket 215. The second cover 228 may be disposed on another surface of the second bracket 227 opposite to the surface of the second bracket 227. The sub-display panel 235 may be disposed between the second bracket 227 and the second cover 228.

According to an embodiment, a portion of the first bracket 215 may be surrounded by the first side surface 213, and a portion of the second bracket 227 may be surrounded by the second side surface 223. For example, the first bracket 215 may be integrally formed with the first side surface 213, and the second bracket 227 may be integrally formed with the second side surface 223. For another example, the first bracket 215 may be formed separately from the first side surface 213, and the second bracket 227 may be formed separately from the second side surface 223.

The at least one electronic component 260 may implement various functions for providing to the user. According to an embodiment, the at least one electronic component 260 may include the first printed circuit board 261, the second printed circuit board 262, the flexible printed circuit board 263, a battery 264 (e.g., a battery 189 of FIG. 1), and/or an antenna 265 (e.g., an antenna module 197 of FIG. 1). The first printed circuit board 261 and the second printed circuit board 262 may form an electrical connection between components within the electronic device 101, respectively. For example, components (e.g., a processor 120 of FIG. 1) for implementing an overall function of the electronic device 101 may be disposed on the first printed circuit board 261, and electronic components for implementing some function of the first printed circuit board 261 may be disposed on the second printed circuit board 262. For another example, components for operating the sub-display panel 235 disposed on the second rear surface 222 may be disposed on the second printed circuit board 262.

According to an embodiment, the first printed circuit board 261 may be disposed in the first housing 210. For example, the first printed circuit board 261 may be disposed on the surface of the first bracket 215. According to an embodiment, the second printed circuit board 262 may be disposed in the second housing 220. For example, the second printed circuit board 262 may be spaced apart from the first printed circuit board 261 and may disposed on the surface of the second bracket 227. The flexible printed circuit board 263 may connect the first printed circuit board 261 and the second printed circuit board 262. For example, the flexible printed circuit board 263 may extend from the first printed circuit board 261 to the second printed circuit board 262.

The battery 264 is a device for supplying power to at least one component of the electronic device 101, and may include, for example, a non-rechargeable primary battery, a rechargeable secondary battery, or a fuel cell. At least a portion of the battery 264 may be disposed on substantially the same flat surface as the first printed circuit board 261 or the second printed circuit board 262.

The antenna 265 may be configured to receive power or a signal from the outside of the electronic device 101. According to an embodiment, the antenna 265 may be disposed between the first cover 216 and the battery 264. The antenna 265 may include, for example, a near field communication (NFC) antenna, an antenna module, and/or a magnetic secure transmission (MST) antenna. The antenna 265 may, for example, perform short-range communication with an external device, or wirelessly transmit and receive power required for charging.

Figure 3A:
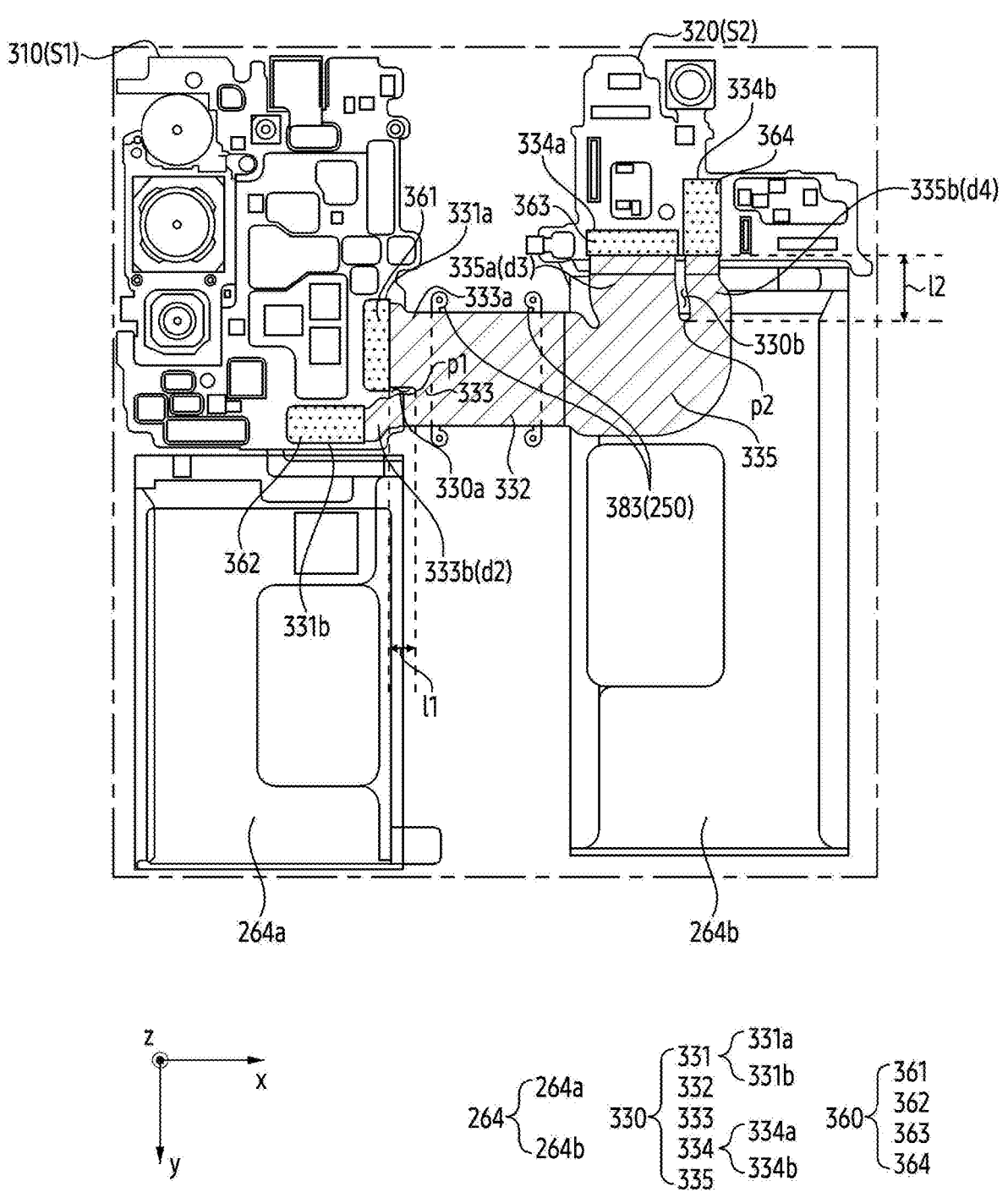
FIGS. 3A, 3B, and 3C illustrate a portion of an example electronic device according to various embodiments.
Figure 3B:
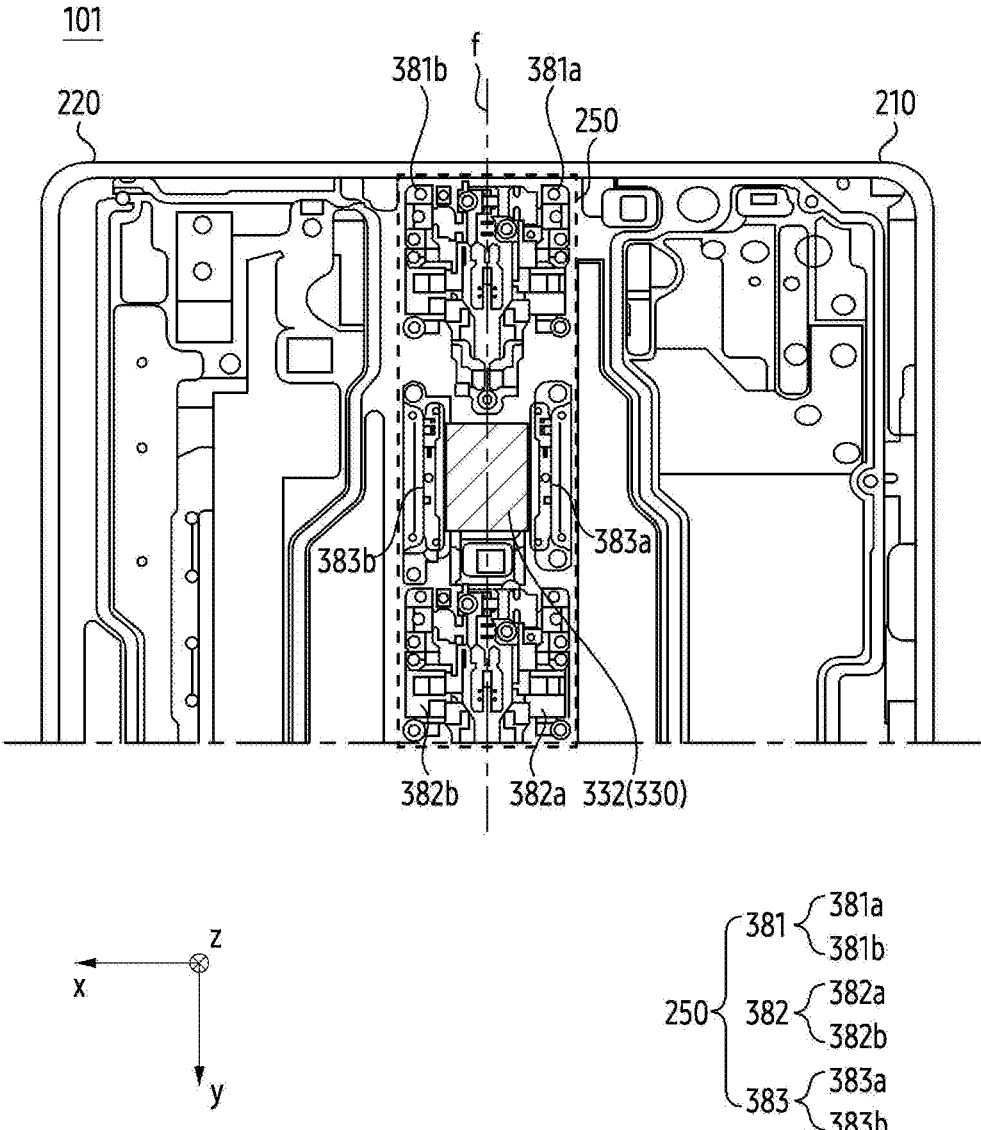
Figure 3C:
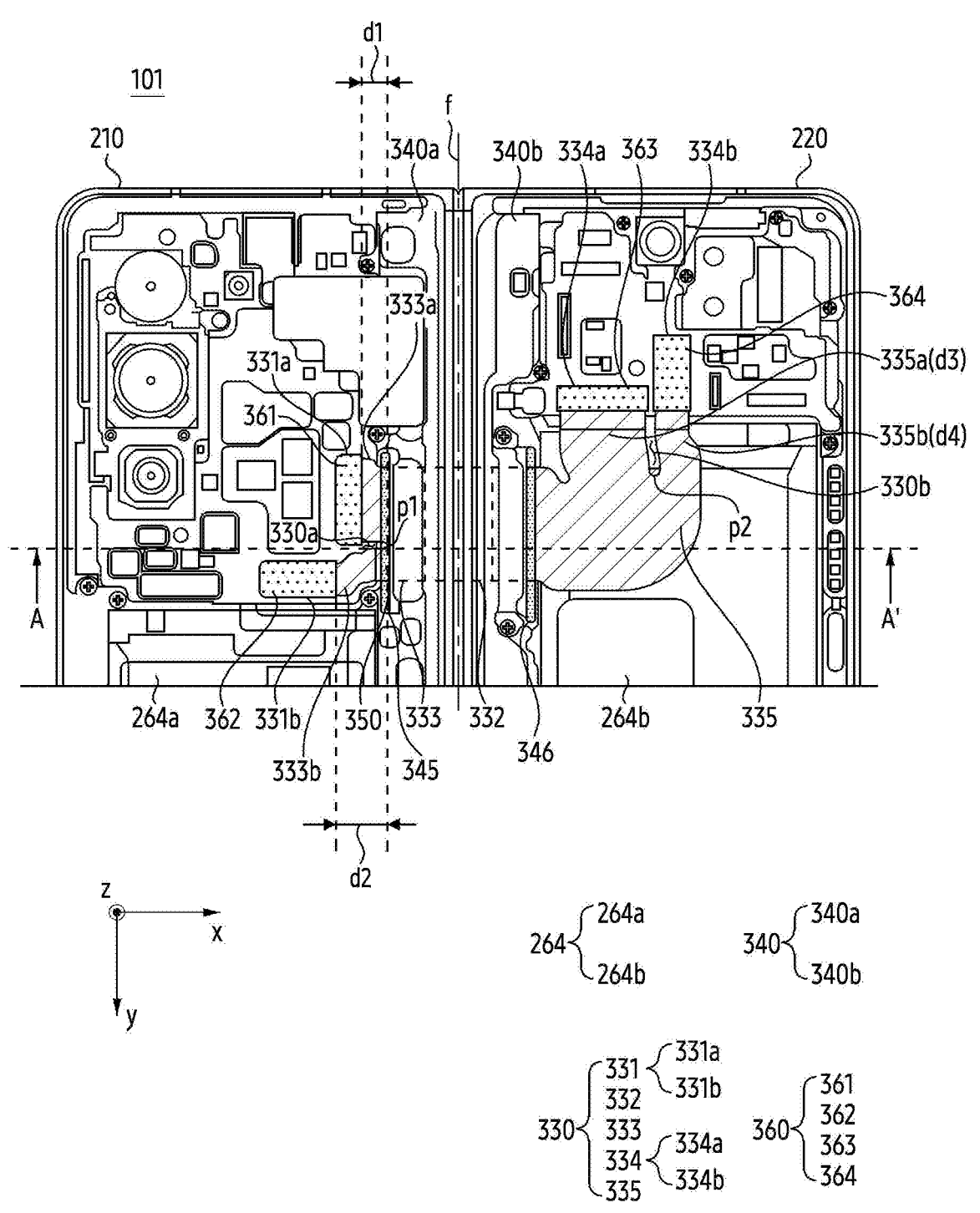

FIGS. 3A, 3B, and 3C illustrate a portion of an example electronic device according to various embodiments.

Referring to FIGS. 3A, 3B, and 3C, an electronic device 101 may include a first housing 210, a second housing 220, a hinge structure 250, a first printed circuit board 310 (e.g., a first printed circuit board 261 of FIG. 2C), a second printed circuit board 320 (e.g., a second printed circuit board 262 of FIG. 2C), a flexible printed circuit board 330 (e.g., a flexible printed circuit board 263 of FIG. 2C), a support plate 340, and a waterproof member (e.g., including a waterproof material) 350.

According to an embodiment, the hinge structure 250 may rotatably connect the first housing 210 and the second housing 220. For example, when referring to FIGS. 2A to 2C together, the hinge structure 250 may provide a plurality of states including a folding state and an unfolded state of the electronic device 101 by rotatably coupling the first housing

210 and the second housing 220. For example, the hinge structure 250 may at least partially overlap the first housing 210 and/or the second housing 220. For example, the hinge structure 250 may be disposed at least partially between the first housing 210 and the second housing 220. For example, the hinge structure 250 may be configured to deform at least a portion (e.g., a third display region 233 of FIG. 2A) of a display (e.g., a display 230 of FIG. 2A) by rotatably connecting the first housing 210 and the second housing 220. For example, the hinge structure 250 may provide a folding axis f such that the first housing 210 is rotatable with respect to the second housing 220.

According to an embodiment, the first printed circuit board 310 may be disposed in the first housing 210. The second printed circuit board 320 may be disposed in the second housing 220 and may be spaced apart from the first printed circuit board 310. For example, the first printed circuit board 310 may be fastened to the first housing 210. The second printed circuit board 320 may be separated from the first printed circuit board 310, by being fastened to the second housing 220. For example, electronic components in the first housing 210 may be mounted on the first printed circuit board 310. Other electronic components in the second housing 220 spaced apart from the electronic components in the first housing 210 may be mounted on the second printed circuit board 320. For example, a processor (e.g., a processor 120 of FIG. 1), memory (e.g., memory 130 of FIG. 1), and/or an interface (e.g., an interface 177 of FIG. 1) may be mounted on the first printed circuit board 310 and/or the second printed circuit board 320. The processor may include, for example, one or more of a central processing unit, an application processor, a graphics processing unit, an image signal processor, a sensor hub processor, or a communication processor. The memory may include, for example, volatile memory (e.g., volatile memory 132 of FIG. 1) or non-volatile memory (e.g., non-volatile memory 134 of FIG. 1). The interface may include, for example, a high definition multimedia interface (HDMI), a universal serial bus (USB) interface, an SD card interface, and/or an audio interface. The interface may electrically or physically connect the electronic device 101 to an external electronic device, and may include a USB connector, an SD card/multimedia card (MMC) connector, or an audio connector. The electronic device 101 may require a structure connecting the first printed circuit board 310 and the second printed circuit board 320 in order to electrically connect at least some of the electronic components in the first housing 210 and at least some of the other electronic components in the second housing 220.

According to an embodiment, the flexible printed circuit board 330 may connect the first printed circuit board 310 and the second printed circuit board 320 by extending from the first printed circuit board 310 across the hinge structure 250 to the second printed circuit board 320. For example, the flexible printed circuit board 330 may be electrically connect the first printed circuit board 310 and the second printed circuit board 320, by being coupled to the first printed circuit board 310 and the second printed circuit board 320. For example, at least a portion (e.g., a first connector 331) of the flexible printed circuit board 330 may be disposed in the first housing 210 in order to be connected to the first printed circuit board 310. For example, at least a portion (e.g., a fourth connector 334) of the flexible printed circuit board 330 may be disposed in the second housing 220 in order to be connected to the second printed circuit board 320. For example, the flexible printed circuit board 330 may include a rigid flexible printed circuit board. The flexible printed circuit board 330 may be referred to as a connector to connector (CTC) FPCB in that it connects the first printed circuit board 310 and the second printed circuit board 320, but is not limited thereto.

For example, at least a portion (e.g., a second connector 332) of the flexible printed circuit board 330 may be disposed on the hinge structure 250 in order to electrically connect the first printed circuit board 310 and the second printed circuit board 320. In the present disclosure, when an element is referred to as being "on" another element, it should be understood that it may be directly on the other element or intervening elements may exist therebetween. For example, in the present disclosure, "B disposed on A" may indicate "B disposed over A.". For example, in the present disclosure, "B disposed on A" may indicate "B facing A and spaced apart from A.". For example, "the flexible printed circuit board 330 disposed on the hinge structure 250" may refer, for example, to "the flexible printed circuit board 330 in contact with the hinge structure 250". For example, "the flexible printed circuit board 330 disposed on the hinge structure 250" may refer, for example, to "the flexible printed circuit board 330 facing the hinge structure 250 and spaced apart from the hinge structure 250. For example, the flexible printed circuit board 330 may overlap at least a portion (e.g., a seating portion 383) of the hinge structure 250 when viewed from above (e.g., when viewed in a −z direction). For example, the flexible printed circuit board 330 may extend from inside of the first housing 210 across over the hinge structure 250 to inside of the second housing 220, in order to connect the first printed circuit board 310 and the second printed circuit board 320. The electronic device 101 may be configured to electrically connect the first printed circuit board 310 in the first housing 210 and the second printed circuit board 320 in the second housing 220 by including the flexible printed circuit board 330.

According to an embodiment, the support plate 340 may be coupled to the hinge structure 250. The support plate 340 may include a hole 345 in which a portion of the flexible printed circuit board 330 is disposed.

For example, the support plate 340 may be at least partially covered by the hinge structure 250. For example, the support plate 340 may pass at least the portion of the flexible printed circuit board 330. For example, the support plate 340 may fasten at least the portion of the flexible printed circuit board 330 to the support plate 340 so that the flexible printed circuit board 330 does not separate from the support plate 340. For example, the support plate 340 may extend from the first printed circuit board 310 disposed inside the first housing 210, across over the hinge structure 250 (e.g., across in a +x direction), to the second printed circuit board 320 disposed inside the second housing 220.

For example, the support plate 340 may be a component of the housing 200. For example, the support plate 340 may be the component of the housing 200 for supporting the hinge structure 250 and/or the display (e.g., the display 230 of FIG. 2A). For example, a portion of the support plate 340 may form at least a portion of the first housing 210, and a remaining portion of the support plate 340 may form at least a portion of the second housing 220. For example, the support plate 340 may be referred to as a first bracket 215 and a second bracket 227 of FIG. 2C, but is not limited thereto.

For example, the support plate 340 may include a first support plate 340a (e.g., the first bracket 215 of FIG. 2C) fastened to the first housing 210, and a second support plate 340b (e.g., the second bracket 227 of FIG. 2C) fastened to the second housing 220. The first support plate 340a may be configured to be rotatable with respect to the second support plate 340b along the first housing 210 that rotates with respect to the second housing 220 based on the folding axis f. For example, the first support plate 340a may fasten a portion (e.g., a third connector 334a) of the flexible printed circuit board 330 in the first housing 210 to the first housing 210. For example, the second support plate 340b may fasten the portion of the flexible printed circuit board 330 (e.g., the fifth part 335) in the second housing 220 to the second housing 220.

For example, the hole 345 may be formed along a periphery of the first printed circuit board 310. For example, the hole 345 may be formed in a portion of the support plate 340 adjacent to the first printed circuit board 310. For example, the flexible printed circuit board 330 may penetrate the hole 345. The flexible printed circuit board 330 may be located at least partially in the hole 345 by penetrating the hole 345. For example, the hole 345 may be disposed in the first housing 210. For example, the hole 345 may penetrate the first support plate 340a, disposed in the first housing 210, among the support plate 340. For example, the hole 345 may accommodate at least a portion of the flexible printed circuit board 330. The support plate 340 may be configured such that the flexible printed circuit board 330 is connected to the first printed circuit board 310 through the hole 345, by including the hole 345.

According to an embodiment, the waterproof member 350 may be disposed in the hole 345. For example, the waterproof member 350 may fill at least a portion of the hole 345. For example, the waterproof member 350 may be configured to reduce inflow of a foreign substance from outside of the electronic device 101 into a space between the support plate 340 and the hinge structure 250 through the hole 345, by occupying inside of the hole 345. For example, by being located in the hole 345, the waterproof member 350 may contact the at least a portion of the flexible printed circuit board 330 penetrating the hole 345. For example, the waterproof member 350 may accommodate the at least a portion of the flexible printed circuit board 330 by filling the inside of the hole 345. The waterproof member 350 may fasten the at least a portion of the flexible printed circuit board 330 in the hole 345. For example, at least a portion of the waterproof member 350 may be configured to fill the inside of the hole 345 by injecting a waterproof material into the hole 345, but is not limited thereto. The electronic device 101 may prevent and/or inhibit/block the foreign substance from flowing from the outside of the electronic device 101 into a space between the support plate 340 and the hinge structure 250 through the hole 345, by including the waterproof member 350.

According to an embodiment, the flexible printed circuit board 330 may include a plurality of conductive pins 360 for being connected to the first printed circuit board 310 and/or the second printed circuit board 320. The plurality of conductive pins 360 may connect at least some of the plurality of layers to each other by contacting conductive patterns included in each of the plurality of layers. The plurality of conductive pins 360 connecting at least some of the plurality of layers to each other, may connect the flexible printed circuit board 330 (or a plurality of layers of the flexible printed circuit board) and the first printed circuit board 310 and/or the second printed circuit board 320 to each other, by penetrating the flexible printed circuit board 330 and connecting to a conductive pattern in the first printed circuit board 310 and/or a conductive pattern in the second printed circuit board 320. For example, the plurality of conductive pins 360 may penetrate the flexible printed circuit board 330. The plurality of conductive pins 360 may penetrate, for example, a plurality of layers included in the flexible printed circuit board 330. The plurality of conductive pins 360 may be disposed in a portion (e.g., a first region 331, a fourth region 334) of the flexible printed circuit board 330 connected to the first printed circuit board 310 and/or the second printed circuit board 320. For example, the plurality of conductive pins 360 may electrically connect the first printed circuit board 310 and/or the second printed circuit board 320 and the flexible printed circuit board 330. For example, the plurality of conductive pins 360 may be configured to receive power from a power management module (e.g., a power management module 188 of FIG. 1) and/or a battery 264 through the flexible printed circuit board 330. The flexible printed circuit board 330 may electrically connect the first printed circuit board 310 and the second printed circuit board 320 through the plurality of conductive pins 360. The flexible printed circuit board 330 may be configured to transmit data from the first printed circuit board 310 to the second printed circuit board 320 or to transmit the data from the second printed circuit board 320 to the first printed circuit board 310, by including the plurality of conductive pins 360.

According to an embodiment, the flexible printed circuit board 330 may include the first region 331 connected to the first printed circuit board 310. The first region 331 may include a first connector 331*a* including a first set of conductive pins 361 and a second connector 331*b* including second connector 331*b* including a second set of conductive pins 362 and spaced apart from the first connector 331*a*. For example, the first region 331 may be a region disposed on the first printed circuit board 310. For example, the first region 331 may be a region fastened to the first printed circuit board 310. For example, the first region 331 may be a region coupled to the first printed circuit board 310. For example, the first region 331 may be a region overlapping the first printed circuit board 310 when viewed from above (e.g., when viewed in the −z direction). For example, the first region 331 may be a region in which at least some (e.g., the first set of conductive pins 361 and the second set of conductive pins 362) of the plurality of conductive pins 360 electrically connected to the first printed circuit board 310 are disposed in the first housing 210. For example, the first region 331 may be disposed on a surface (e.g., a first surface 310*a* of FIG. 4A) opposite to a surface (e.g., a second surface 310*b* of FIG. 4A) facing the display (e.g., the display 230 of FIG. 2A, a flexible display 430 of FIG. 4A) of the printed circuit board 310.

For example, the first connector 331*a* may be a portion electrically connected to the first printed circuit board 310 through the first set of conductive pins 361. For example, the first connector 331*a* may extend along the hole 345 in a direction in which the hole 345 extends (e.g., a +y direction). For example, the first connector 331*a* may have a major axis in a direction parallel to the folding axis f. For example, the first connector 331*a* may have a minor axis in a direction perpendicular to the folding axis f. For example, the first connector 331*a* may be more adjacent to the hole 345 than the second connector 331*b* spaced apart from the first connector 331*a*. However, it is not limited thereto. For example, the second connector 331*b* may be separated from the first connector 331*a*. For example, the second connector 331*b* may be electrically connected to the first printed circuit board 310 through the second set of conductive pins 362. For example, the second connector 331*b* may be disposed along a first battery 264*a* disposed in the first housing 210.

For example, the second connector 331*b* may have a long axis in the direction perpendicular to the folding axis f. For example, the second connector 331*b* may have a short axis in the direction parallel to the folding axis f. However, it is not limited thereto. The flexible printed circuit board 330 may provide a space for electronic components mounted on the first printed circuit board 310 and may be configured such that the plurality of conductive pins 360 for connection with the first printed circuit board 310 are disposed in the flexible printed circuit board 330, by including the first region 331 including the first connector 331*a* and the second connector 331*b* spaced apart from the first connector 331*a*.

According to an embodiment, the flexible printed circuit board 330 may include a first set of conductive lines (e.g., a first set of conductive lines 521 of FIG. 5) connected to the first set of conductive pins 361, and a second set of conductive lines (e.g., a second set of conductive lines 522 of FIG. 5) connected to the second set of conductive pins 362. For example, the first set of conductive lines 521 may be connected to a first connection portion of the first printed circuit board 310 through the first set of conductive pins 361. The first connection portion may be a portion connected to the first connector 331*a*. For example, the second set of conductive lines 522 may be connected to a second connection portion of the first printed circuit board 310 through the second set of conductive pins 362. The second connection portion may be a portion connected to the second connector 331*b*. For example, each of the first set of conductive lines 521 and the second set of conductive lines 522 may provide various functions, by being connected to the first printed circuit board 310. The first set of conductive lines 521 and the second set of conductive lines 522 will be described later in FIG. 5.

According to an embodiment, the flexible printed circuit board 330 may include a second region 332 between the support plate 340 and the hinge structure 250. For example, the second region 332 may be disposed on at least a portion (e.g., the seating portion 383) of the hinge structure 250. For example, the second region 332 may be covered by the support plate 340. For example, the second region 332 may be a region that overlaps the hinge structure 250 when the flexible printed circuit board 330 is viewed from above (e.g., when viewed in the −z direction). For example, the second region 332 may be a region disposed under the support plate 340 with respect to a +z-axis direction. The flexible printed circuit board 330 may be configured such that the flexible printed circuit board 330 electrically connects the first printed circuit board 310 and the second printed circuit board 320 across the hinge structure 250 by including the second region 332.

According to an embodiment, the flexible printed circuit board 330 may include a third region 333, connecting the first region 331 and the second region 332 through the hole 345, including a slit 330*a* for separating the first connector 331*a* and the second connector 331*b* of the first region 331. For example, the third region 333 may extend from the first region 331 to the second region 332. For example, at least a portion of the third region 333 may face the support plate 340 by being connected to the second region 332. A remaining portion of the third region 333 may be disposed on the first printed circuit board 310 by being connected to the first region 331 through the hole 345 of the support plate 340. For example, the at least a portion of the third region 333 may be fastened to the support plate 340.

For example, the slit 330*a* may be formed in the third region 333. For example, at least a portion of the slit 330*a* may be disposed on the first printed circuit board 310. For example, the slit 330*a* may be formed by separating the first connector 331*a* and the second connector 331*b* of the first region 331. For example, the slit 330*a* may extend from the first region 331 toward the hole 345. For example, the slit 330*a* may be disposed between portions (e.g., a first branch portion 333*a* and a second branch portion 333*b*) connected to the first connector 331*a* and the second connector 331*b* spaced apart from the first connector 331*a* in the third region 333, respectively. The slit 330*a* may be referred to as a gap formed between the portions respectively connected to the first connector 331*a* and the second connector 331*b* in the third region 333, but is not limited thereto. The third region 333 may be configured to separate the first connector 331*a* and the second connector 331*b* by including the slit 330*a*, and to easily fasten the first connector 331*a* and the second connector 331*b* to the first printed circuit board 310.

According to an embodiment, the slit 330*a* may be formed between the first set of conductive lines 521 connected to the first set of conductive pins 361 and the second set of conductive lines 522 connected to the second set of conductive pins 362, to separate the first connector 331*a* and the second connector 331*b* from each other. A portion of the slit 330*a* may be disposed in the waterproof member 350.

According to an embodiment, the first region 331 may be disposed along a periphery 315 of the first printed circuit board 310. For example, the first connector 331*a* of the first region 331 may be disposed along a first peripheral part 315*a* adjacent to the hole 345 of the support plate 340 among the periphery 315 of the first printed circuit board 310. The second connector 331*b* spaced apart from the first connector 331*a* may be disposed along a second peripheral part 315*b* connected to the first peripheral part 315*a* among the periphery 315 of the first printed circuit board 310. The first region 331 may be configured to provide additional space on the first printed circuit board 310 for electronic components mounted on the first printed circuit board 310, by being disposed along the periphery 315 of the first printed circuit board 310.

According to an embodiment, a size S1 of the first printed circuit board 310 may be larger than a size S2 of the second printed circuit board 320. For example, when the electronic device 101 is viewed from above (e.g., when viewed in the −z direction), an area of the first printed circuit board 310 may be larger than an area of the second printed circuit board 320. For example, a volume of a space occupied by the first printed circuit board 310 in the first housing 210 may be greater than a volume of a space occupied by the second printed circuit board 320 in the second housing 220.

According to an embodiment, since the size S1 of the first printed circuit board 310 may be larger than the size S2 of the second printed circuit board 320, the first region 331 of the flexible printed circuit board 330 connected to the first printed circuit board 310 may be disposed along the periphery 315 of the first printed circuit board 310 adjacent to the hole 345 of the support plate 340. Since a length (e.g., a length d1 of the first branch portion 333*a* and/or a length d2 of the second branch portion 333*b*) of the third region 333 passing through the hole 345 and extending to the first region 331 disposed along the periphery 315 is relatively short, a probability of damage to the third region 333 may increase by the slit 330*a* in the third region 333. The flexible printed circuit board 330 may require a structure for reducing damage to the third region 333 of the flexible printed circuit board 330.

According to an embodiment, the slit 330*a* may be at least partially disposed in the waterproof member 350 by extending from the first region 331 into the hole 345.

For example, the slit 330*a* may be formed in the third region 333 in which at least a portion is disposed inside the hole 345. For example, the slit 330*a* may be at least partially disposed in the hole 345. For example, the slit 330*a* may be at least partially filled by the waterproof member 350 disposed in the hole 345, by being at least partially disposed in the hole 345. For example, the at least a portion of the waterproof member 350 may pass through the at least a portion of the slit 330*a*. For example, the slit 330*a* may extend from the first region 331 toward the waterproof member 350. For example, the at least a portion of the slit 330*a* may allow the waterproof material of the waterproof member 350 to pass through. For example, the slit 330*a* may be at least partially surrounded by the hole 345. For example, the at least a portion of the slit 330*a* may face an inner surface of the hole 345. The slit 330*a* extends from the first region 331 into the hole 345, thereby reducing damage to the third region 333 by the slit 330*a*.

According to an embodiment, the third region 333 may include the first branch portion 333*a* connected to the first connector 331*a* and the second branch portion 333*b* connected to the second connector 331*b* and separated from the first branch portion 333*a* by the slit 330*a*. A bifurcation point p1 in the slit 330*a*, in which the first branch portion 333*a* and the second branch portion 333*b* are separated, may be located in the hole 345 of the support plate 340.

For example, the first branch portion 333*a* may be a portion of the third region 333 extending from the first connector 331*a* to the inside of the hole 345. The second branch portion 333*b* may be a portion of the third region 333 extending from the second connector 331*b* to the inside of the hole 345. The slit 330*a* may be formed by being separated from the first branch portion 333*a* and the second branch portion 331*b*.

The bifurcation point p1 of the slit 330*a* may be a portion at which separation of the first branch portion 333*a* and the second branch portion 333*b* initiates. For example, the first branch portion 333*a* may be separated from the second branch portion 333*b* based on the bifurcation point p1. For example, the bifurcation point p1 may be referred to as an end of the slit 330*a*, but is not limited thereto.

For example, the bifurcation point p1 may be located in the hole 345. For example, the bifurcation point p1 may be covered by the waterproof member 350 by being disposed in the hole 345. For example, the bifurcation point p1 may be surrounded by the hole 345. For example, the bifurcation point p1 may face the inner surface of the hole 345. For example, at least a portion of the first branch portion 333*a* and at least a portion of the second branch portion 333*b* may be disposed in the hole 345. For example, the first branch portion 333*a* and the second branch portion 333*b* may be separated inside of the hole 345. For example, the first branch portion 333*a* and the second branch portion 333*b* may at least partially contact the waterproof member 350. For example, the first branch portion 333*a* and the second branch portion 333*b* may be fastened to the support plate 340 by the waterproof member 350. The bifurcation point p1 of the slit 330*a* in which the first branch portion 333*a* and the second branch portion 333*b* are separated is disposed in the hole 345, so that the flexible printed circuit board 330 may reduce damage to the third area 333 for connecting to the first printed circuit board 310 of the first region 331.

According to an embodiment, the length d1 of the first branch portion 333*a* may be smaller than the length d2 of the second branch portion 333*b*. The length d1 of the first branch portion 333*a* may be located within a range of 2 mm or more and 4 mm or less. For example, since the first connector 331*a* is disposed along the first peripheral part 315*a* adjacent to the hole 345, and the second connector 331*b* spaced apart from the first connector 331*a* is disposed along the second peripheral part 315*b* connected to the first peripheral part 315*a*, the length d1 of the first branch portion 333*a* extending from the inside of the hole 345 to the first connector 331*a* based on the bifurcation point p1 may be smaller than the length d2 of the second branch portion 333*b* extending from the inside of the hole 345 to the second connector 331*b*. The length d1 of the first branch portion 333*a* may correspond to a length 11 of the slit 330*a*. The length d1 of the first branch portion 333*a* smaller than the length d2 of the second branch portion 333*b* is located within a range of 2 mm or more and 4 mm or less, so that the flexible printed circuit board 330 may reduce damage to the third region 333 for connecting the first region 331 to the first printed circuit board 310.

According to an embodiment, the hinge structure 250 may include a first hinge 381, a second hinge 382 spaced apart from the first hinge 381, and the seating portion 383 between the first hinge 381 and the second hinge 382 for accommodating the third region 333 of the flexible printed circuit board 330. For example, the first hinge 381 may include a first plate 381*a* coupled to the first housing 210 and a second plate 381*b* coupled to the second housing 220. The first plate may be rotatable with respect to the second plate 381*b* based on the folding axis f so as to rotate the first housing 210 based on the folding axis f. For example, the second hinge 382 may be spaced apart from the first hinge 381, so that the hinge structure 250 may be configured to form a space between the first hinge 381 and the second hinge 382. The second hinge 382 may include a third plate 382*a* coupled to the first housing 210 and a fourth plate 382*b* coupled to the second housing 220. The third plate 382*a* may be rotatable with respect to the fourth plate 382*b* based on the folding axis f so as to rotate the first housing 210 based on the folding axis f.

For example, the seating portion 383 may connect the first hinge 381 and the second hinge 382. The seating portion 383 may provide a seating space for the second region 332 of the flexible printed circuit board 330 such that the flexible printed circuit board 330 connects the first printed circuit board 310 and the second printed circuit board 320 through the space between the first hinge 381 and the second hinge 382. For example, the seating portion 383 may include a first seating structure 383*a* between the first plate 381*a* and the third plate 382*a*, and a second seating structure 383*b* between the second plate 381*b* and the fourth plate 382*b*. However, it is not limited thereto, and the hinge structure 250 may be configured such that the first printed circuit board 310 and the second printed circuit board 320 are electrically connected to each other, by including a structure for passing the flexible printed circuit board 330 connecting the first printed circuit board 310 in the first housing 210 and the second printed circuit board 320 in the second housing 220.

According to an embodiment, the flexible printed circuit board 330 may include the fourth region 334 including a third connector 334*a* connected to the second printed circuit board 320 and including a third set of conductive pins 363, and a fourth connector 334*b* spaced apart from the third connector 334*a* and including a fourth set of conductive pins 364. The flexible printed circuit board 330 may include a fifth region 335 including another slit 330*b* for connecting the fourth region 334 and the second region 332 and separating the third connector 334*a* and the fourth connector 334*b*.

For example, the fourth region 334 may be a region disposed on the second printed circuit board 320. For example, the fourth region 334 may be a region fastened to the second printed circuit board 320. For example, the fourth region 334 may be a region coupled to the second printed circuit board 320. For example, the fourth region 334 may be a region in which at least some (e.g., the third set of conductive pins 363 and the fourth set of conductive pins 364) of the plurality of conductive pins 360 electrically connected to the second printed circuit board 320 are disposed in the second housing 220. For example, the third connector 334*a* may be a portion electrically connected to the second printed circuit board 320 through the third set of conductive pins 363. For example, the third connector 334*a* may extend in the direction perpendicular to the folding axis f, but is not limited thereto. For example, the fourth connector 334*b* may be separated from the third connector 334*a*. For example, the fourth connector 334*b* may be electrically connected to the second printed circuit board 320 through the fourth set of conductive pins 364. For example, the fourth connector 334*b* may extend in the direction parallel to the folding axis f, but is not limited thereto. The flexible printed circuit board 330 may be configured to provide a space for electronic components mounted on the second printed circuit board 320 and so that a plurality of conductive pins 360 for connection with the second printed circuit board 320 are disposed within the flexible printed circuit board 330, by including the fourth region 334 including a third connector 334*a* and a fourth connector 334*b* spaced apart from the third connector 334*a*.

For example, the fifth region 335 may extend from the second region 332 to the fourth region 334. For example, the support plate 340 may include another hole 346 for passing through the fifth region 335. The other hole 346 may be formed in the second support plate 340*b* coupled to the second housing 220. The fifth region 335 may connect the second region 332 and the fourth region 334 through the other hole 346. For example, since the size S1 of the first printed circuit board 310 is greater than the size S2 of the second printed circuit board 320, another slit 330*b* in the fifth region 335 for separating the third connector 334*a* and the fourth connector 334*b* may be disposed outside the other hole 346 passing through the fifth region 335. The other slit 330*b* may be disposed, for example, at least partially on a second battery 246*b* in the second housing 220. For example, a third branch portion 335*a* of the fifth region 335 may be disposed outside the other hole 346 extending from the third connector 334*a* and passing through the fifth region 335. The fourth branch portion 335*b* separated from the third branch portion 335*a* by the other slit 330*b* of the fifth region 335 may be disposed outside the other hole 346. Another bifurcation point p2 of the other slit 330*b* in which the third branch portion 335*a* and the fourth branch portion 335*b* are separated may be located, for example, on a second battery 264*b* in the second housing 220. The other slit 330*b* for separating the third connector 334*a* and the fourth connector 334*b* connected to the second printed circuit board 320 is disposed outside the other hole 346, so that the flexible printed circuit board 330 may reduce damage to the fifth region 335 connecting the second region 332 and the fourth region 334 by the other slit 330*b*.

According to an embodiment, the length 11 of the slit 330*a* in the third region 333 may be smaller than a length 12 of the other slit 330*b* in the fifth region 335. A second battery 372 may be spaced apart from the second printed circuit board 320. The fifth region 335 may extend from the second region 332 across over the second battery 264*b* to the fourth region 334. For example, the length 11 of the slit 330a may correspond to the smaller of the length d1 of the first branch portion 333a and the length d2 of the second branch portion 333b. The length 12 of the other slit 330b may correspond to the smaller of a length d3 of the third branch portion 335a and a length d4 of the fourth branch portion 335b. The length 11 of the slit 330a extending from the first region 331 to the inside of the hole 345 may be smaller than the length 12 of the other slit 330b extending from the fourth region 334 and disposed outside the other hole 346. For example, since the length 12 of the other slit 330b is greater than the length 11 of the slit 330a, at least a portion of the fifth region 335 including the other slit 330b may be at least partially disposed on the second battery 264b in the second housing 220 adjacent to the second printed circuit board 320. The fifth region 335 may reduce damage to the fifth region 335 by the other slit 330b, by extending from the second region 332 across over the second battery 264b to the fourth region 334.

According to the above-described embodiment, the flexible printed circuit board 330 of the electronic device 101 may electrically connect the first printed circuit board 310 to the second printed circuit board 320, by extending from the first printed circuit board 310 across the hinge structure 250 to the second printed circuit board 320. The flexible printed circuit board 330 may be configured to reduce damage to the third region 333 including the slit 330a by the slit 330a and so that the first region 331 is easily fastened to the first printed circuit board 310, by including the slit 330a extending from the first region 331 connected to the first printed circuit board 310 into the hole 345 of the support plate 340.

Figure 4A:
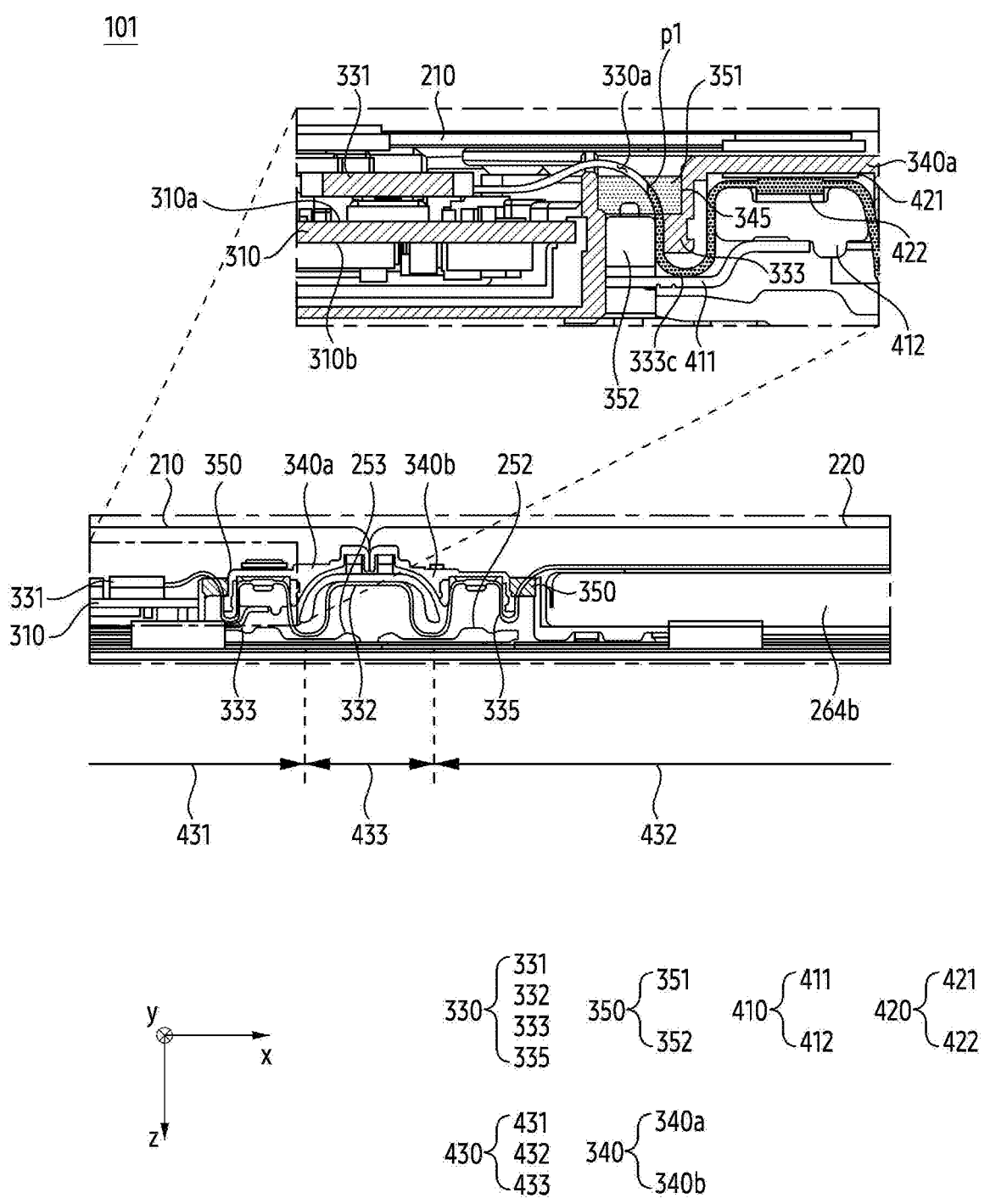
FIG. 4A is a partial cross-sectional view of an example electronic device cut along line A-A' of FIG. 3C according to various embodiments.
Figure 4B:
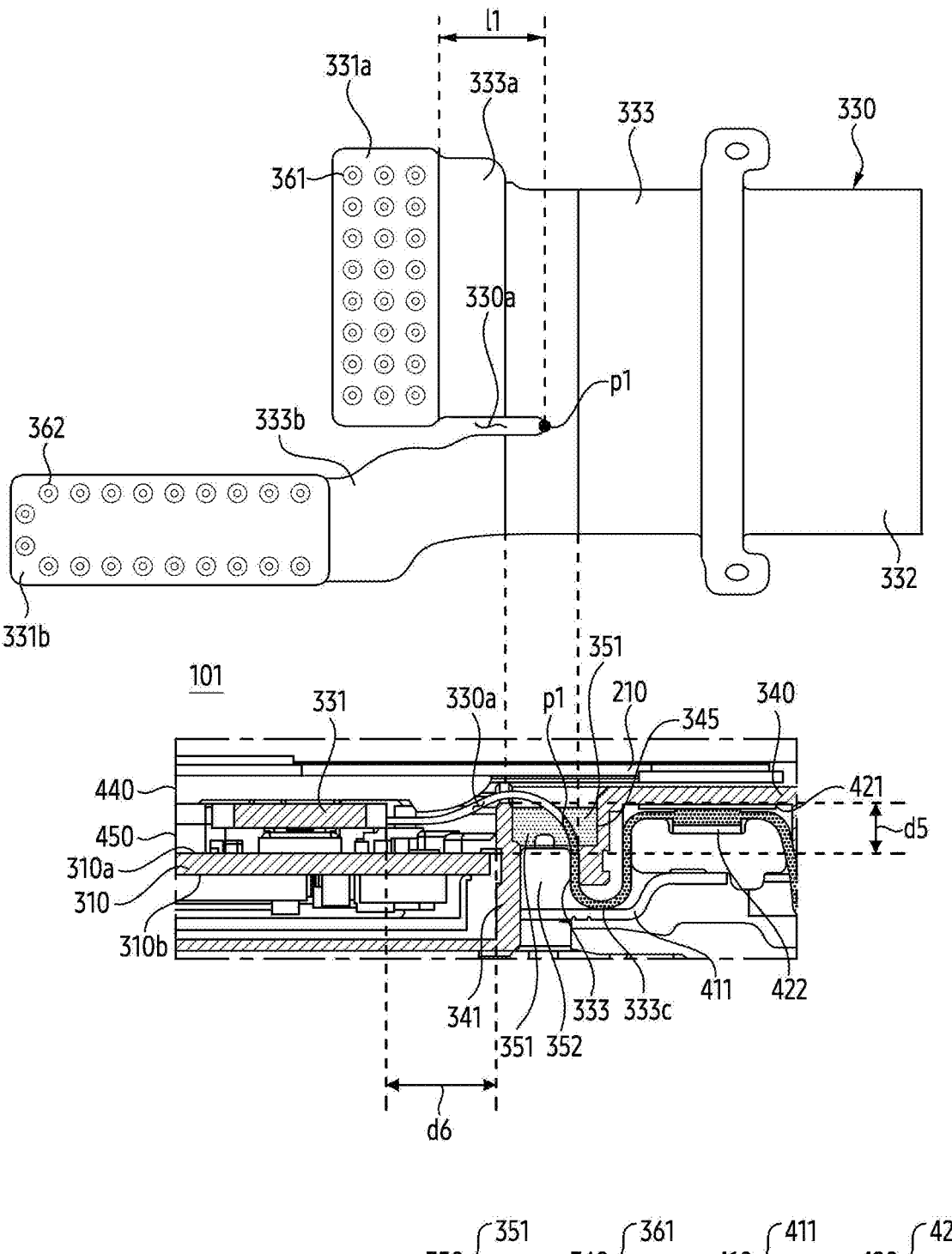
FIG. 4B illustrates a portion of an example electronic device according to various embodiments.

FIG. 4A is a partial cross-sectional view of an example electronic device cut along line A-A' of FIG. 3C according to various embodiments. FIG. 4B illustrates a portion of an example electronic device according to various embodiments.

Referring to FIGS. 4A and 4B, an electronic device 101 may include a first housing 210, a second housing 220, and a hinge structure 250 rotatably connecting the first housing 210 and the second housing 220. The electronic device 101 may include a first printed circuit board 310 disposed in the first housing 210, a second printed circuit board 320 disposed in the second housing 220 and spaced apart from the first printed circuit board 310, and a flexible printed circuit board 330 connecting the first printed circuit board 310 and the second printed circuit board 320 by extending from the first printed circuit board 310 across the hinge structure 250 to the second printed circuit board 320. The electronic device 101 may include a support plate 340 on the hinge structure 250 including a hole 345 for passing the flexible printed circuit board 330 and a waterproof member 350 disposed within the hole 345. The flexible printed circuit board 330 may include a first region 331 including a first connector 331a connected to the first printed circuit board 310 and including a first set of conductive pins, and a second connector 331b including a second set of conductive pins and spaced apart from the first connector 331a. The flexible printed circuit board 330 may include a second region 332 between the support plate 340 and the hinge structure 250. The flexible printed circuit board 330 may include a third region 333 including a slit 330a for connecting the first region 331 and the second region 332 through the hole 345, and separating the first connector 331a and the second connector 331b. The slit 330a may be at least partially disposed within the waterproof member 350 by extending from the first region 331 into the hole 345. According to an embodiment, the hinge structure 250 may include a first hinge plate 252 coupled to the first housing 210 and a second hinge plate 253 coupled to the second housing 220.

Hereinafter, a description for a configuration having the same reference numeral as described above in FIGS. 3A, 3B and 3C may not be repeated.

According to an embodiment, the electronic device 101 may include at least one support member 410 for fasting the flexible printed circuit board 330 to the support plate 340. The third region 333 of the flexible printed circuit board 330 may include at least one bending portion 333c bent by the at least one support member 410 in order to connect the first region 331 and the second region 332.

For example, the at least one support member 410 may contact the flexible printed circuit board 330. For example, the at least one support member 410 may press the flexible printed circuit board 330 toward the support plate 340. For example, the at least one support member 410 may be covered by the support plate 340. For example, the at least one support member 410 may include a first support member 411 and a second support member 412 for supporting the third region 333 of the flexible printed circuit board 330. The first support member 411 may extend from an inner surface of the hole 345 toward the second region 332 of the flexible printed circuit board 330. The first support member 411 may fasten the third region 333 to a first support plate 340a in which the hole 345 is formed by pressing at least a portion of the third region 333 passing through the hole 345. For example, the third region 333 pressed by the first support member 411 may be a region of the flexible printed circuit board 330 that may be deformed by having flexibility. For example, the second support member 412 may be supported by the first support member 411, by being disposed on the first support member 411. The second support member 412 may fasten the third region 333 to the first support plate 340a, by pressing the third region 333 of the flexible printed circuit board 330 together with the first support member 411 toward the first support plate 340a. For example, the third region 333 pressed by the second support member 412 may be a portion of the flexible printed circuit board 330 having relatively high rigidity. The electronic device 101 may reduce separation of the third region 333 of the flexible printed circuit board 330 from the support plate 340, by including the first support member 411 and the second support member 412.

Although the at least one support member 410 has been described as including the first support member 411 and the second support member 412, it is not limited thereto. The at least one support member 410 may include a plurality of support members for fastening a fifth region 335 of the flexible printed circuit board 330 to a second support plate 340b coupled to the second housing 220.

For example, the at least one bending portion 333c may be disposed between at least one support member 410 and the support plate 340. The flexible printed circuit board 330 may be configured such that the flexible printed circuit board 330 is fastened to the support plate 340 and connected to the first printed circuit board 310 through the hole 345 of the support plate 340, by including the at least one bending portion 333c.

According to an embodiment, the electronic device 101 may include at least one adhesive member 420 for attaching the flexible printed circuit board 330 to the support plate 340. For example, the at least one adhesive member 420 may include a first adhesive member 421 between the flexible printed circuit board 330 and the support plate 340. For example, the at least one adhesive member 420 may include a second adhesive member 422 between the flexible printed circuit board 330 and the at least one support member 410. For example, the flexible printed circuit board 330 may be attached on the second support member 412 by the second adhesive member 422 attached on the second support member 412. The flexible printed circuit board 330 attached to the second support member 412 may be attached to the support plate 340 through the first adhesive member 421 by coupling the support plate 340 to which the first adhesive member 421 is attached to the first housing 210 and the second housing 220. The flexible printed circuit board 330 may be fastened to the support plate 340, by being attached to the support plate 340 by the first adhesive member 421 and pressed by the support plate 340 and the second support member 412. However, it is not limited thereto.

According to an embodiment, the electronic device 101 may include a flexible display 430 (e.g., a display module 160 of FIG. 1 and a display 230 of FIG. 2A). The flexible display 430 may include a first display region 431 (e.g., a first display region 231 of FIG. 2A) coupled to the first housing 210, a second display region 432 (e.g., a second display region 232 of FIG. 2A) coupled to the second housing 220, and a deformable third display region 433 (e.g., a third display region 233 of FIG. 2A) connecting the first display region 431 and the second display region 432. For example, the first display region 431 may be disposed on the first housing 210. The second display region 432 may be spaced apart from the first display region 431 and may be disposed on the second housing 220. For example, the first display region 431 and the second display region 432 may be referred to as a flat portion of the flexible display 430 in that they substantially form a flat surface, but are not limited thereto. For example, the third display region 433 may extend from the first display region 431 to the second display region 432. The third display region 433 may be disposed on the hinge structure 250. For example, the third display region 433 may be configured to be deformed by rotating the first housing 210 with respect to the second housing 220 by the hinge structure 250. For example, the third display region 433 may be a region disposed on the second region 332 of the flexible printed circuit board 330. The electronic device 101 may provide various user experiences to a user, by including the flexible display 430 including the deformable third display region 433.

According to an embodiment, the electronic device 101 may include an antenna structure 440, disposed on the first region 331, for communication with an external electronic device (e.g., an electronic device 102, 104 of FIG. 1) and an interposer 450 facing the flexible printed circuit board 330 by being disposed between the first region 331 and the antenna structure 440. For example, the first printed circuit board 310 may include a first surface 310a to which the first region 331 is fastened, and a second surface 310b opposite to the first surface 310a and facing the flexible display 430. The antenna structure 440 may be disposed on the first surface 310a of the first printed circuit board 310 to which the first region 331 of the flexible printed circuit board 330 is fastened. The antenna structure 440 may at least partially face the first region 331. For example, the antenna structure 440 may overlap the first region 331 when the first surface 310a of the first printed circuit board 310 is viewed from above. The antenna structure 440 may be referred to as a near field communication (NFC) antenna for short-range wireless communication, but is not limited thereto. For example, the interposer 450 may be disposed between the first surface 310a of the first printed circuit board 310 and the antenna structure 440. For example, the interposer 450 may support the antenna structure 440 by interposing between the first printed circuit board 310 and the antenna structure 440.

For example, by the antenna structure 440 on the first region 331, a length of the third region 333 extending from the first region 331 through the hole 345 may be limited. A slit 330a in the third region 333 may reduce damage to the third region 333 due to the short length of the third region 333, by extending from the first region 331 to inside of the hole 345. For example, a bifurcation point p1 of the slit 330a in which a first branch portion 333a and a second branch portion 333b of the third region 333 are separated, may be located in the hole 345 in which the waterproof member 350 is disposed.

For example, by the antenna structure 440 and the interposer 450, the first region 331 including the first connector 331a and the second connector 331b may be disposed adjacent to the hole 345. For example, since a space between the first printed circuit board 310 and the antenna structure 440 is relatively small, the first connector 331a and the second connector 331b may be disposed on a periphery of the first printed circuit board 310. The slit 330a may reduce damage to the flexible printed circuit board 330 by the slit 330a, by being at least partially disposed within the waterproof member 350 inside the hole 345.

According to an embodiment, the waterproof member 350 may include at least one of a cure in place gasket (CIPG) and rubber. The first region 331 of the flexible printed circuit board 330 may include a carbon nanotube (CNT).

For example, the waterproof member 350 may include a first waterproof member 351 and a second waterproof member 352. The first waterproof member 351 may be filled in the hole 345 after the flexible printed circuit board 330 passes through the hole 345. The second waterproof member 352 may press at least a portion of the flexible printed circuit board 330 passing through the hole 345 toward the inner surface of the hole 345. The second waterproof member 352 may occupy the inside of the hole 345 together with the first waterproof member 351. For example, at least a portion of the slit 330a may be filled by the first waterproof member 351. For example, the bifurcation point p1 of the slit 330a in which the first branch portion 333a and the second branch portion 333b are separated may be located in the first waterproof member 351. According to an embodiment, the first waterproof member 351 may include the CIPG, and the second waterproof member 352 may include the rubber, but are not limited thereto.

According to an embodiment, the support plate 340 may include a sidewall 341 forming at least a portion of the hole 345 and protruding toward the third region 333. A length d5 of the sidewall 341 protruding from the first surface 310a on which the first region 331 of the first printed circuit board 310 is disposed toward the third region 333 may be located within a range of 1 mm or more and 2 mm or less. A distance d6 between the sidewall 341 and the first region 331 may be located within a range of 2 mm or more and 4 mm or less. The length d5 is located within a range of 1 mm or more and 2 mm or less and the distance d6 is located within a range of 2 mm or more and 4 mm or less, so that the length of the third region 333 extending from the inside of the hole 345 to the first region 331 may be limited. The slit 330a in the third region 333 may reduce damage to the third region 333 due to the short length of the third region 333, by extending from the first region 331 to the inside of the hole 345. For example, a length l1 of the slit 330a may be greater than a distance d6 between the sidewall 341 and the first region 331. However, it is not limited thereto.

According to the above-described embodiment, the flexible printed circuit board 330 may be configured to reduce damage to the third region 333 including the slit 330a by the slit 330a and to easily fastened the first region 331 to the first printed circuit board 310, by including the slit 330a extending from the first region 331 connected to the first printed circuit board 310 into the hole 345 of the support plate 340.

Figure 5:
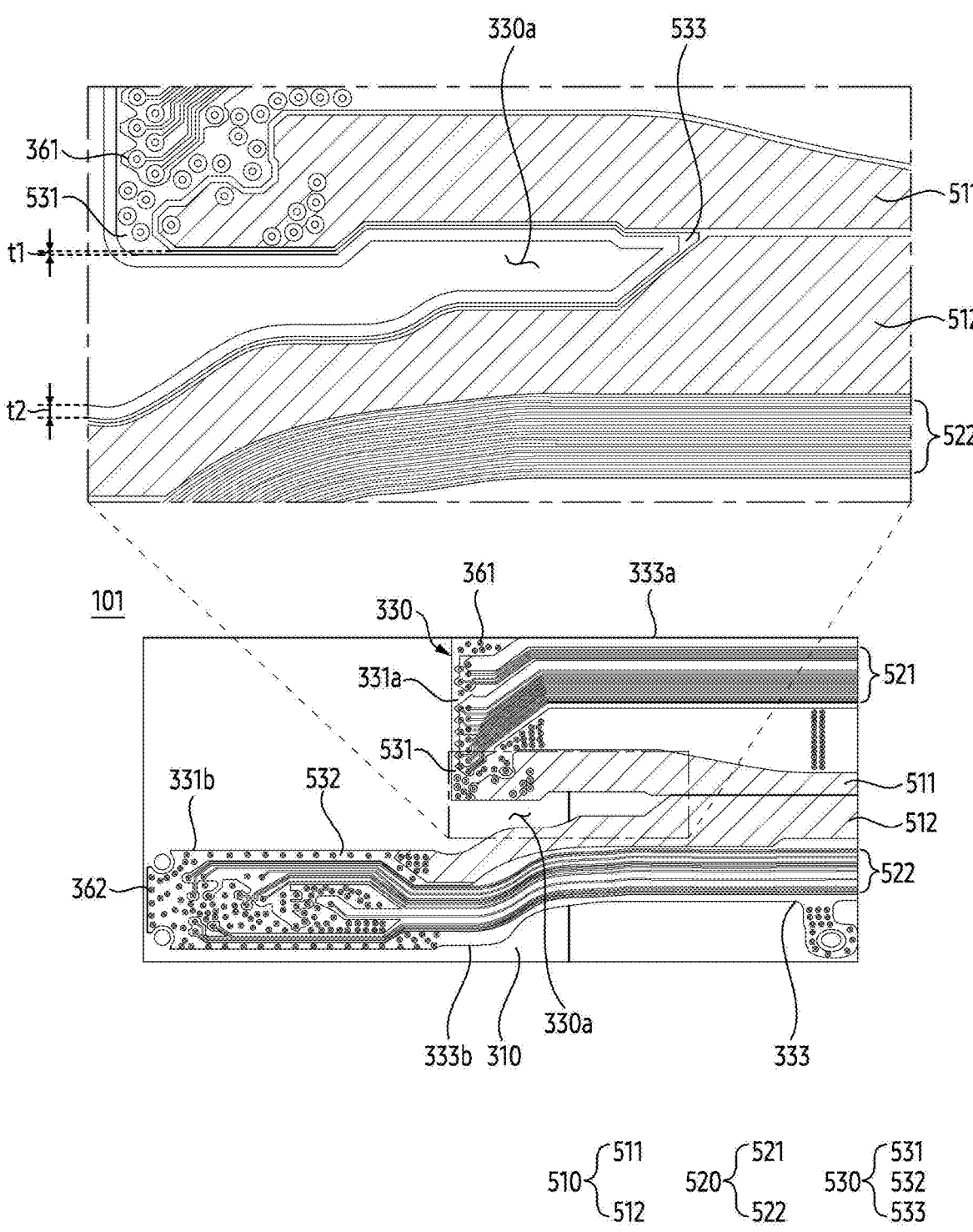
FIG. 5 illustrates a portion of a flexible printed circuit board of an example electronic device according to various embodiments.

FIG. 5 illustrates a portion of a flexible printed circuit board of an example electronic device according to various embodiments.

Referring to FIG. 5, an electronic device 101 may include a first housing (e.g., a first housing 210 of FIG. 2A), a second housing (e.g., a second housing 220 of FIG. 2A), and a hinge structure (e.g., a hinge structure 250 of FIG. 3C) rotatably connecting the first housing 210 and the second housing 220. The electronic device 101 may include a first printed circuit board (e.g., a first printed circuit board 310 of FIG. 3A) disposed in the first housing 210, a second printed circuit board (e.g., a second printed circuit board 320 of FIG. 3A) disposed in the second housing 220 and spaced apart from the first printed circuit board 310, and a flexible printed circuit board 330 connecting the first printed circuit board 310 and the second printed circuit board 320 by extending from the first printed circuit board 310 across the hinge structure 250 to the second printed circuit board 320. The electronic device 101 may include a support plate (e.g., a support plate 340 of FIG. 3B) on the hinge structure 250 including a hole (e.g., a hole 345 of FIG. 3C) for passing the flexible printed circuit board 330, and a waterproof member (e.g., a waterproof member 350 of FIG. 3C) disposed within the hole 345. The flexible printed circuit board 330 may include a first region 331 including a first connector 331a connected to the first printed circuit board 310 and including a first set of conductive pins, and a second connector 331b including a second set of conductive pins and spaced apart from the first connector 331a. The flexible printed circuit board 330 may include a second region (e.g., a second region 332 of FIG. 3A) between the support plate 340 and the hinge structure 250. The flexible printed circuit board 330 may include a third region 333 including a slit 330a for connecting the first region 331 and the second region 332 through the hole 345, and separating the first connector 331a and the second connector 331b. The slit 330a may be at least partially disposed within the waterproof member 350 by extending from the first region 331 into the hole 345.

According to an embodiment, the flexible printed circuit board 330 may include a power supply region 510, a plurality of signal lines 520, and a ground region 530 for supplying power to electronic components on the first printed circuit board 310, through a plurality of conductive pins 360.

For example, the power supply region 510 may include a first power supply region 511 for supplying power to the electronic components of the first printed circuit board 310 through at least some of a first set of conductive pins 361 in the first connector 331a, and a second power supply region 512 for supplying power to the electronic components of the first printed circuit board 310 through at least some of a second set of conductive pins 362 in the second connector 331b. The first power supply region 511 may extend, for example, from a first branch portion 333a to the first connector 331a. The second power supply region 512 may extend from a second branch portion 333b to the second connector 331b. The first power supply region 511 and the second power supply region 512 may be disposed along the slit 330a separating the first branch portion 333a and the second branch portion 333b. For example, the plurality of signal lines 520 may include a first set of conductive lines 521 for transmitting data to the first set of conductive pins 361, and a second set of conductive lines 522 for transmitting data to the second set of conductive pins 362.

For example, the power supply region 510 may include a plurality of power signal lines for supplying power to electronic components mounted on the first printed circuit board 310. For example, the first set of conductive lines 521 may be configured to transmit a signal to a display (e.g., a display 230 of FIG. 2A) connected to the first printed circuit board 310 through the first set of conductive pins 361. For example, the second set of conductive lines 522 may be configured to transmit the signal to the display 230 connected to the first printed circuit board 310, a sensor module (e.g., a sensor module 176 of FIG. 1), a camera module (e.g., a camera module 180 of FIG. 1), an audio module (e.g., an audio module 170 of FIG. 1), and a universal subscriber identity module (USIM), through the second set of conductive pins 362. However, it is not limited thereto.

According to an embodiment, the ground region 530 may include a first ground region 531 in the first connector 331a, a second ground region 532 in the second connector 331b, and a third ground region 533 between the first power supply region 511 and the second power supply region 512 disposed along the slit 330a. The third ground region 533 may connect the first ground region 531 and the second ground region 532. A thickness t1 of the third ground region 533 may be located within a range of 0.1 mm or more and 0.2 mm or less. For example, as at least a portion of the third ground region 533 is removed, a length (e.g., a length 11 of FIG. 3A) of the slit 330a may increase. As the thickness t1 of the third ground region 533 is located within a range of 0.1 mm or more and 0.2 mm or less, the slit 330a may be configured to extend from the first region 331 into the hole 345 of the support plate 340.

According to an embodiment, a thickness t2 between the third ground region 533 and the slit 330a of the flexible printed circuit board 330 may be located within a range of 1.5 mm or more and 2.5 mm or less. As the thickness t2 between the slit 330a and the third ground region 533 of the flexible printed circuit board 330 is located within a range of 1.5 mm or more and 2.5 mm or less, the flexible printed circuit board 330 may reduce exposure of the third ground region 533 and/or the power supply region 510 to the outside due to damage to the flexible printed circuit board 330.

According to the above-described embodiment, the flexible printed circuit board 330 may extend the length 11 of the slit 330a by adjusting the thickness t1 of the third ground region 533 disposed along the slit 330a. The slit 330a may reduce damage to the third region 333 of the flexible printed circuit board 330 by the slit 330a, by extending from the first region 331 to inside of the hole 345.

According to an example embodiment, an electronic device (e.g., an electronic device 101 of FIG. 1) may comprise: a first housing (e.g., a first housing 210 of FIG. 2A), a second housing (e.g., a second housing 220 of FIG. 2A), and a hinge structure (e.g., a hinge structure 250 of FIG. 2C) rotatably connecting the first housing and the second housing. The electronic device may comprise a first printed circuit board (PCB) (e.g., a first printed circuit board (PCB) 310 of FIG. 3A) disposed in the first housing, a second PCB (e.g., a second PCB 320 of FIG. 3A) disposed in the second housing, and a flexible printed circuit board (FPCB) (e.g., a flexible printed circuit board (FPCB) 330 of FIG. 3A) extending from the first printed circuit board across the hinge structure to the second printed circuit board to connect the first printed circuit board and the second printed circuit board. The electronic device may comprise a support plate (e.g., a support plate 340 of FIG. 3C) coupled to the hinge structure including a hole (e.g., a hole 345 of FIG. 3C) through which a portion of the FPCB is disposed, and a waterproof member (e.g., a waterproof member 350 of FIG. 3C), comprising a waterproof material, disposed in the hole with the portion of the FPCB. The flexible printed circuit board may include a first connector (e.g., a first connector 331a of FIG. 3A) including a first set of conductive pins (e.g., a first set of conductive pins 361 of FIG. 3A) config- ured to connect to a first connecting portion of the first PCB, and a second connector (e.g., a second connector 331b of FIG. 3A) including a second set of conductive pins (e.g., a second set of conductive pins 362 of FIG. 3A) configured to connect to a second connecting portion of the first PCB. The flexible printed circuit board may include a first set of conductive lines (e.g., a first set of conductive lines 521 of FIG. 5) connected to the first set of conductive pins, and a second set of conductive lines connected to the second set of conductive pins. The flexible printed circuit board may include a slit (e.g., a slit 330a of FIG. 3A) formed between the first set of conductive lines and the second set of conductive lines to separate the first connector and the second connector. A portion of the slit may be disposed in the waterproof member. According to an example embodi- ment, the electronic device may electrically connect the first printed circuit board and the second printed circuit board by including the flexible printed circuit board. The flexible printed circuit board may reduce damage to the flexible printed circuit board by the slit extending into the hole. The above-mentioned embodiment may have various effects including the above-mentioned effect.

According to an example embodiment, the FPCB may further include: a first branch portion (e.g., a first branch portion 333a of FIG. 3A) connected to the first connector, and a second branch portion (e.g., a second branch portion 333b of FIG. 3A) connected to the second connector and separated from the first branch portion by slit. The bifurca- tion point (e.g., p1 of FIG. 3A) in the slit at which the first branch portion and the second branch portion is separated may be located in the hole. According to the above-de- scribed embodiment, the FPCB may reduce damage to the FPCB by the slit by extending the slit into the hole. The above-mentioned embodiment may have various effects including the above-mentioned effect.

According to an example embodiment, a length (e.g., d1 of FIG. 3A) of the first branch portion may be less than a length (e.g., d2 of FIG. 3A) of the second branch portion. The length of the first branch portion may be in a range of 2 mm or more and 4.5 mm or less. According to the above-described embodiment, the FPCB may reduce dam- age to the FPCB by the slit by extending the slit into the hole. The above-mentioned embodiment may have various effects including the above-mentioned effect.

The electronic device according to an example embodi- ment may further comprise: at least one support member (e.g., at least one support member 410 of FIG. 4A) config- ured to fasten the FPCB to the support plate. The FPCB may further include an at least one bending portion (e.g., at least one bending portion 333c of FIG. 4A) bent by the at least one support member. According to the above-mentioned embodiment, the electronic device may reduce separation of the FPCB from the support plate by including the at least one support member. The above-mentioned embodiment may have various effects including the above-mentioned effect.

The electronic device according to an example embodi- ment may further comprise an adhesive member (e.g., a first adhesive member 421 of FIG. 3A), comprising an adhesive material, disposed between the FPCB and the support plate to attach the FPCB to the support plate. According to the above-mentioned embodiment, the electronic device may reduce the separation of the FPCB from the support plate by including the adhesive member. The above-mentioned embodiment may have various effects including the above- mentioned effect.

The electronic device according to an example embodi- ment may further comprise an antenna structure (e.g., an antenna structure 440 of FIG. 4B) disposed on the first connector and the second connector configured to commu- nicable with an external electronic device (e.g., an electronic device 102 of FIG. 1), and an interposer (e.g., an interposer 450 of FIG. 4B) disposed between the first PCB and the antenna structure. According to the above-mentioned embodiment, the electronic device may be configured to communicate with the external electronic device by includ- ing the antenna structure. The above-mentioned embodi- ment may have various effects including the above-men- tioned effect.

According to an example embodiment, the hinge structure may include a first hinge (e.g., a first hinge 381 of FIG. 3B), a second hinge (e.g., a second hinge 382 of FIG. 3B) spaced apart from the first hinge, and a seating portion (e.g., a seating portion 383 of FIG. 3A) between the first hinge and the second hinge configured to accommodate at least a portion of the FPCB. According to the above-mentioned embodiment, the hinge structure may be configured such that the FPCB connects the first PCB and the second PCB by including the seating portion. The above-mentioned embodi- ment may have various effects including the above-men- tioned effect.

According to an example embodiment, the waterproof member may include at least one of cure in place gasket (CIPG), and rubber. The FPCB may include carbon nano- tube (CNT). According to the above-mentioned embodi- ment, the waterproof member may reduce the inflow of foreign substances into a space between the support plate and the hinge structure from outside, by including the CIPG and the rubber. The above-mentioned embodiment may have various effects including the above-mentioned effect.

According to an example embodiment, a size (e.g., S1 of FIG. 3A) of the first PCB may be greater than a size (e.g., S2 of FIG. 3A) of the second PCB. According to the above-mentioned embodiment, the size of the first PCB may be greater than the size of the second PCB, so that the first PCB may provide additional space for electronic compo- nents mounted on the first PCB. The above-mentioned embodiment may have various effects including the above- mentioned effect.

According to an example embodiment, the FPCB may further include: a third connector (e.g., a third connector 334a of FIG. 3A) connected to the second PCB and includ- ing a third set of conductive pins (e.g., a third set of conductive pins 363 of FIG. 3A), a fourth connector (e.g., a fourth connector 334b of FIG. 3A) including a fourth set of conductive pins (e.g., a fourth set of conductive pins 364 of FIG. 3A)) and spaced apart from the third connector, and another slit (e.g., another slit 330b of FIG. 3A) for separating the third connector and the fourth connector. According to the above-mentioned embodiment, the FPCB may be elec- trically connected to the second PCB, by including the third connector and the fourth connector. The above-mentioned embodiment may have various effects including the above- mentioned effect.

The electronic device according to an example embodiment may further comprise a battery (e.g., a second battery 264*b* of FIG. 3A) spaced apart from the second PCB in the second housing. A length (e.g., 11 of FIG. 3A) of the slit may be less than a length of the other slit (e.g., 12 of FIG. 3A). The FPCB may extend across over the battery to the third connector and the fourth connector. According to the above-mentioned embodiment, the FPCB may reduce damage to the FPCB by the other slits by extending across over the battery to the third connector and the fourth connector. The above-mentioned embodiment may have various effects including the above-mentioned effect.

According to an example embodiment, the FPCB may further include a first power supply region (e.g., a first power supply region 511 of FIG. 5) configured to supply power to the first set of conductive pins, a second power supply region (e.g., a second power supply region 512 of FIG. 5) configured to supply power to the second set of conductive pins, and a ground region (e.g., a third ground region 533 of FIG. 5) between the first power supply region and the second power supply region disposed along the slit. A thickness of the ground region may be located within a range of 0.1 mm or more and 0.2 mm or less. According to the above-mentioned embodiment, the FPCB may reduce damage to the FPCB by the slit, by locating the thickness of the ground region within a range of 0.1 mm or more and 0.2 mm or less. The above-mentioned embodiment may have various effects including the above-mentioned effect.

The electronic device according to an example embodiment may further comprise: a flexible display (e.g., a flexible display 430 of FIG. 4A) including a first display region (e.g., a first display region 431 of FIG. 4A) coupled with the first housing, a second display region (e.g., a second display region 432 of FIG. 4A) coupled with the second housing, and a third display region (e.g., a third display region 433 of FIG. 4A) which is deformable connecting the first display region and the second display region. According to the above-mentioned embodiment, the flexible display may provide various user experiences to a user by including the deformable third display region. The above-mentioned embodiment may have various effects including the above-mentioned effect.

According to an example embodiment, the first connector and the second connector may be disposed along a periphery (e.g., a periphery 315 of FIG. 3A) of the first PCB. According to the above-mentioned embodiment, the FPCB may provide additional space for electronic components mounted on the first PCB by being disposed along the periphery. The above-mentioned embodiment may have various effects including the above-mentioned effect.

According to an example embodiment, the support plate may further include a sidewall (e.g., a sidewall 341 of FIG. 4B) forming at least a portion of the hole and protruding toward the slit. A length (e.g., d5 of FIG. 4B) of the sidewall protruding from one surface of the first PCB on which the first connecting portion and the second connecting portion is disposed toward the slit may be located within a range of 1 mm or more and 2 mm or less. A distance (e.g., d6 of FIG. 4B) between the sidewall and the first connector is located within a range of 2 mm or more and 4 mm or less. According to the above-mentioned embodiment, the FPCB may reduce damage to the FPCB by the slit and the sidewall by extending the slit into the hole. The above-mentioned embodiment may have various effects including the above-mentioned effect.

According to an example embodiment, an electronic device may comprise: a first housing, a second housing, and a hinge structure rotatably connecting the first housing and the second housing. The electronic device may comprise a first PCB disposed in the first housing, a second PCB disposed in the second housing and spaced apart from the first PCB, and an FPCB extend from the first PCB across the hinge structure to the second PCB to connect the first PCB and the second PCB. The electronic device may comprise a support plate on the hinge structure including a hole through which the FPCB passes, an adhesive member, comprising an adhesive material, disposed between the FPCB and the support plate to attach the FPCB to the support plate, and a waterproof member, comprising a waterproof material, disposed in the hole. The FPCB may include: a first region connected to the first PCB and including a first connector including a first set of conductive pins and a second connector including a second set of conductive pins and spaced apart from the first connector. The FPCB may include a second region between the support plate and the hinge structure. The FPCB may include a third region connecting the first region and the second region through the hole and including a slit for separating the first connector and the second connector. The slit may be at least partially disposed in the waterproof member by extending from the first region into the hole. A size of the first PCB may be greater than a size of the second PCB. According to the above-mentioned embodiment, the electronic device may electrically connect the first PCB and the second PCB by including the FPCB. The FPCB may reduce damage to the third region by the slit by extending the slit into the hole. The above-mentioned embodiment may have various effects including the above-mentioned effect.

According to an example embodiment, the third region may further include a first branch portion connected to the first connector, and a second branch portion connected to the second connector and separated from the first branch portion by slit. A bifurcation point in the slit at which the first branch portion and the second branch portion is separated may be located in the hole. According to the above-mentioned embodiment, the flexible printed circuit board may reduce damage to the third region by the slit by extending the slit into the hole. The above-mentioned embodiment may have various effects including the above-mentioned effect.

The electronic device according to an example embodiment may further comprise at least one support member configured to fasten the FPCB to the support plate. The third region may further include at least one bending portion bent by the at least one support member to connect the first region and the second region. According to the above-mentioned embodiment, the electronic device may reduce the separation of the FPCB from the support plate by including the at least one support member. The above-mentioned embodiment may have various effects including the above-mentioned effect.

According to an example embodiment, the FPCB further may include: a fourth region connected to the second PCB and including a third connector including a third set of conductive pins and a fourth connector including a fourth set of conductive pins and spaced apart from the third connector; and a fifth region connecting the fourth region and the second region and including another slit for separating the third connector and the fourth connector. According to the above-mentioned embodiment, the FPCB may be electrically connected to the second PCB, by including the fourth region and the fifth region. The above-mentioned embodiment may have various effects including the above-mentioned effect.

According to an example embodiment, the FPCB may further include: a first power supply region configured to supply power to the first set of conductive pins, a second power supply region configured to supply power to the second set of conductive pins, and a ground region between the first power supply region and the second power supply region disposed along the slit. A thickness of the ground region may be located within a range of 0.1 mm or more and 0.2 mm or less. According to the above-mentioned embodiment, the FPCB may reduce damage to the third area by the slit by locating the thickness of the ground region within a range of 0.1 mm or more and 0.2 mm or less. The above-mentioned embodiment may have various effects including the above-mentioned effect.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with" another element (e.g., a second element), the element may be coupled with the other element directly (e.g., wiredly), wirelessly, or via a third element.

As used in connection with various embodiments of the disclosure, the term "module" may include a unit implemented in hardware, software, firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between a case in which data is semi-permanently stored in the storage medium and a case in which the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a first housing;
   a second housing;
   a hinge structure rotatably connecting the first housing and the second housing;
   a first printed circuit board (PCB) disposed in the first housing;
   a second PCB disposed in the second housing;

a flexible printed circuit board (FPCB) extending from the first printed circuit board across the hinge structure to the second printed circuit board to connect the first printed circuit board and the second printed circuit board;

a support plate coupled to the hinge structure including a hole through which a portion of the FPCB is disposed; and a waterproof member, comprising a waterproof material, disposed in the hole with the portion of the FPCB, wherein the flexible printed circuit board includes:

a first connector including a first set of conductive pins configured to connect to a first connecting portion of the first PCB;

a second connector including a second set of conductive pins configured to connect to a second connecting portion of the first PCB;

a first set of conductive lines connected to the first set of conductive pins;

a second set of conductive lines connected to the second set of conductive pins; and a slit formed between the first set of conductive lines and the second set of conductive lines to separate the first connector and the second connector, wherein a portion of the slit is disposed in the waterproof member.

2. The electronic device of claim 1, wherein, the FPCB further includes:

a first branch portion connected to the first connector;

a second branch portion connected to the second connector and separated from the first branch portion by the slit; and wherein, a bifurcation point in the slit at which the first branch portion and the second branch portion is separated is located in the hole.

3. The electronic device of claim 2, wherein, a length of the first branch portion is less than a length of the second branch portion, and wherein, the length of the first branch portion is within a range of 2 mm or more and 4.5 mm or less.

4. The electronic device of claim 1, further comprising:

at least one support member configured to fasten the FPCB to the support plate; and wherein, the FPCB further includes an at least one bending portion bent by the at least one support member.

5. The electronic device of claim 1, further comprising:

an adhesive member, comprising an adhesive material, disposed between the FPCB and the support plate to attach the FPCB to the support plate.

6. The electronic device of claim 1, further comprising:

an antenna structure disposed on the first connector and the second connector configured to communicable with an external electronic device; and an interposer disposed between the first PCB and the antenna structure.

7. The electronic device of claim 1, wherein, the hinge structure includes:

a first hinge;

a second hinge spaced apart from the first hinge; and a seating portion between the first hinge and the second hinge configured to accommodate at least a portion of the FPCB.

8. The electronic device of claim 1, wherein, the waterproof member includes at least one of a cure in place gasket (CIPG), and rubber, and wherein, the FPCB includes a carbon nanotube (CNT).

9. The electronic device of claim 1, wherein, a size of the first PCB is greater than a size of the second PCB.

10. The electronic device of claim 1, wherein, the FPCB further includes:

a third connector connected to the second PCB and including a third set of conductive pins;

a fourth connector including a fourth set of conductive pins and spaced apart from the third connector; and another slit configured to separate the third connector and the fourth connector.

11. The electronic device of claim 10 further comprising:

a battery spaced apart from the second PCB in the second housing; and, wherein, a length of the slit is less than a length of the another slit, and, wherein, the FPCB extends from the first connector and the second connector, across over the battery, to the third connector and the fourth connector.

12. The electronic device of claim 1, wherein, the FPCB further includes:

a first power supply region configured to supply power to the first set of conductive pins;

a second power supply region configured to supply power to the second set of conductive pins; and a ground region between the first power supply region and the second power supply region disposed along the slit; and, wherein, a thickness of the ground region is within a range of 0.1 mm or more and 0.2 mm or less.

13. The electronic device of claim 1, further comprising:

a flexible display including a first display region coupled with the first housing, a second display region coupled with the second housing, and a third display region which is deformable connecting the first display region and the second display region.

14. The electronic device of claim 1, wherein, the first connector and the second connector are disposed along a periphery of the first PCB.

15. The electronic device of claim 1, wherein, the support plate further includes:

a sidewall forming at least a portion of the hole and protruding toward the slit; and wherein, a length of the sidewall protruding from one surface of the first PCB on which the first connecting portion and the second connecting portion is disposed toward the slit is within a range of 1 mm or more and 2 mm or less, and wherein, a distance between the sidewall and the first connector is within a range of 2 mm or more and 4 mm or less.

16. An electronic device comprising:

a first housing;

a second housing;

a hinge structure rotatably connecting the first housing and the second housing;

a first printed circuit board (PCB) disposed in the first housing;

a second PCB disposed in the second housing and spaced apart from the first PCB;

a flexible printed circuit board (FPCB) extending from the first PCB across the hinge structure to the second PCB to connect the first PCB and the second PCB;

a support plate disposed on the hinge structure and including a hole through which the FPCB passes;

an adhesive member, comprising an adhesive material, disposed between the FPCB and the support plate to attach the FPCB to the support plate; and a waterproof member, comprising a waterproof material, disposed in the hole; and, wherein, the FPCB includes:

a first region connected to the first PCB including a first connector including a first set of conductive pins and a second connector including a second set of conductive pins and spaced apart from the first connector;

a second region between the support plate and the hinge structure; and a third region connecting the first region and the second region through the hole and including a slit separating the first connector and the second connector; and, wherein, the slit is at least partially disposed in the waterproof member by extending from the first region into the hole, and wherein, a size of the first PCB is greater than a size of the second PCB.

17. The electronic device of claim 16, wherein, the third region further includes:

a first branch portion connected to the first connector;

a second branch portion connected to the second connector and separated from the first branch portion by the slit; and wherein, a bifurcation point in the slit at which the first branch portion and the second branch portion is separated is located in the hole.

18. The electronic device of claim 16, further comprising:

at least one support member configured to fasten the FPCB to the support plate; and wherein, the third region further includes an at least one bending portion bent by the at least one support member to connect the first region and the second region.

19. The electronic device of claim 16, wherein, the FPCB further includes:

a fourth region connected to the second PCB and including a third connector including a third set of conductive pins and a fourth connector including a fourth set of conductive pins and spaced apart from the third connector; and a fifth region connecting the fourth region and the second region and including another slit separating the third connector and the fourth connector.

20. The electronic device of claim 16, wherein, the FPCB further includes:

a first power supply region configured to supply power to the first set of conductive pins;

a second power supply region configured to supply power to the second set of conductive pins; and a ground region between the first power supply region and the second power supply region disposed along the slit; and, wherein, a thickness of the ground region is within a range of 0.1 mm or more and 0.2 mm or less.

* * * * *